(12) United States Patent
Hoegerl et al.

(10) Patent No.: US 9,349,709 B2
(45) Date of Patent: May 24, 2016

(54) ELECTRONIC COMPONENT WITH SHEET-LIKE REDISTRIBUTION STRUCTURE

(71) Applicant: Infineon Technologies AG, Neubiberg (DE)

(72) Inventors: Juergen Hoegerl, Regensburg (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 74 days.

(21) Appl. No.: 14/096,063

(22) Filed: Dec. 4, 2013

(65) Prior Publication Data

US 2015/0155267 A1    Jun. 4, 2015

(51) Int. Cl.
*H01L 23/04* (2006.01)
*H01L 25/065* (2006.01)
*H01L 25/00* (2006.01)
*H01L 23/00* (2006.01)
*H01L 21/78* (2006.01)
(Continued)

(52) U.S. Cl.
CPC ............ *H01L 25/0655* (2013.01); *H01L 21/78* (2013.01); *H01L 23/3735* (2013.01); *H01L 23/492* (2013.01); *H01L 23/49811* (2013.01); *H01L 23/49816* (2013.01); *H01L 23/49844* (2013.01); *H01L 24/03* (2013.01); *H01L 24/06* (2013.01); *H01L 24/36* (2013.01); *H01L 24/40* (2013.01); *H01L 25/105* (2013.01); *H01L 25/50* (2013.01); *H01L 23/3121* (2013.01); *H01L 2224/0231* (2013.01); *H01L 2224/02371* (2013.01); *H01L 2224/04042* (2013.01); *H01L 2224/05024* (2013.01); *H01L 2224/40137* (2013.01); *H01L 2224/40139* (2013.01); *H01L 2924/01029* (2013.01); *H01L 2924/07025* (2013.01); *H01L 2924/1203* (2013.01); *H01L 2924/12042* (2013.01); *H01L 2924/13055* (2013.01); *H01L 2924/13091* (2013.01); *H01L 2924/14* (2013.01); *H01L 2924/1431* (2013.01); *H01L 2924/181* (2013.01); *H01L 2924/19107* (2013.01)

(58) Field of Classification Search
CPC ..................... H01L 23/5387; H05K 2201/055; H05K 1/145
USPC .......................................................... 257/698
See application file for complete search history.

(56) References Cited

U.S. PATENT DOCUMENTS 7,705,470 B2    4/2010 Otremba
7,718,888 B2 *   5/2010 Cousins .............. H01L 51/4213
                                                            136/243
(Continued)

FOREIGN PATENT DOCUMENTS

DE    10 2005 017 849 A1    10/2006
DE    10 2006 060 768 A1    7/2007
(Continued)

*Primary Examiner* — Andy Huynh
*Assistant Examiner* — Sitaramarao S Yechuri

(57) ABSTRACT

An electronic component comprising an electrically conductive chip carrier comprising an electrically insulating core structure at least partially covered with electrically conductive material, at least one electronic chip each having a first main surface attached to the chip carrier, and a sheet-like redistribution structure attached to a second main surface of the at least one electronic chip and configured for electrically connecting the second main surface of the at least one electronic chip with the chip carrier.

35 Claims, 36 Drawing Sheets

(51) Int. Cl.
   *H01L 23/373*   (2006.01)
   *H01L 23/492*   (2006.01)
   *H01L 23/498*   (2006.01)
   *H01L 25/10*    (2006.01)
   *H01L 23/31*        (2006.01)

(56) References Cited

U.S. PATENT DOCUMENTS

| | | | |
|---|---|---|---|
| 2002/0142513 A1* | 10/2002 | Fee | H01L 21/4846 438/106 |
| 2004/0238936 A1* | 12/2004 | Rumer | H01L 23/481 257/688 |
| 2005/0067714 A1* | 3/2005 | Rumer | H01L 23/055 257/778 |
| 2006/0001163 A1* | 1/2006 | Kolbehdari | H05K 1/147 257/758 |
| 2007/0290322 A1* | 12/2007 | Zhao | H01L 23/367 257/690 |
| 2009/0121346 A1* | 5/2009 | Wachtler | H01L 23/5387 257/724 |
| 2010/0127386 A1* | 5/2010 | Meyer-Berg | H01L 21/565 257/698 |
| 2011/0193205 A1* | 8/2011 | Hsieh | H01L 23/3128 257/666 |
| 2011/0197438 A1* | 8/2011 | Kikuchii | H01L 23/5387 29/832 |
| 2012/0307541 A1 | 12/2012 | Shimoike et al. | |
| 2013/0001797 A1* | 1/2013 | Choi | H01L 25/105 257/774 |
| 2013/0037964 A1* | 2/2013 | Lee | H01L 23/481 257/774 |
| 2013/0277855 A1* | 10/2013 | Kang | H01L 23/49816 257/774 |
| 2014/0353830 A1* | 12/2014 | Carpenter, Jr. | H01L 23/5389 257/758 |

FOREIGN PATENT DOCUMENTS

| | | |
|---|---|---|
| DE | 102006037118 B3 | 3/2008 |
| DE | 10 2008 045 615 A1 | 3/2010 |
| DE | 10 2009 055 648 A1 | 7/2010 |
| DE | 10 2011 000 751 A1 | 12/2011 |
| JP | 2001284525 A | 10/2001 |
| JP | 2013089893 A | 5/2013 |

* cited by examiner

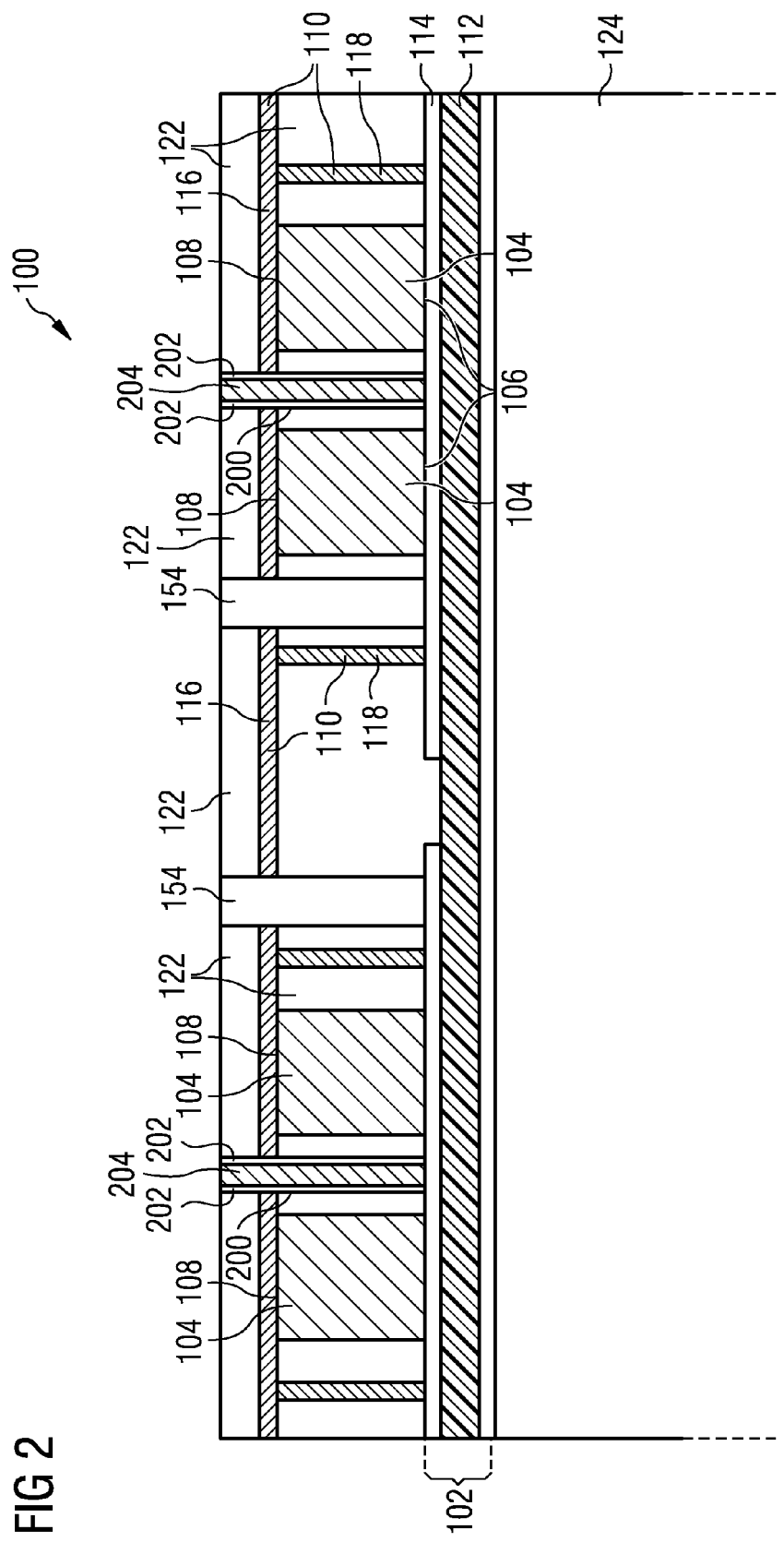

FIG 14
39.0 mm x 55.3 mm DCB
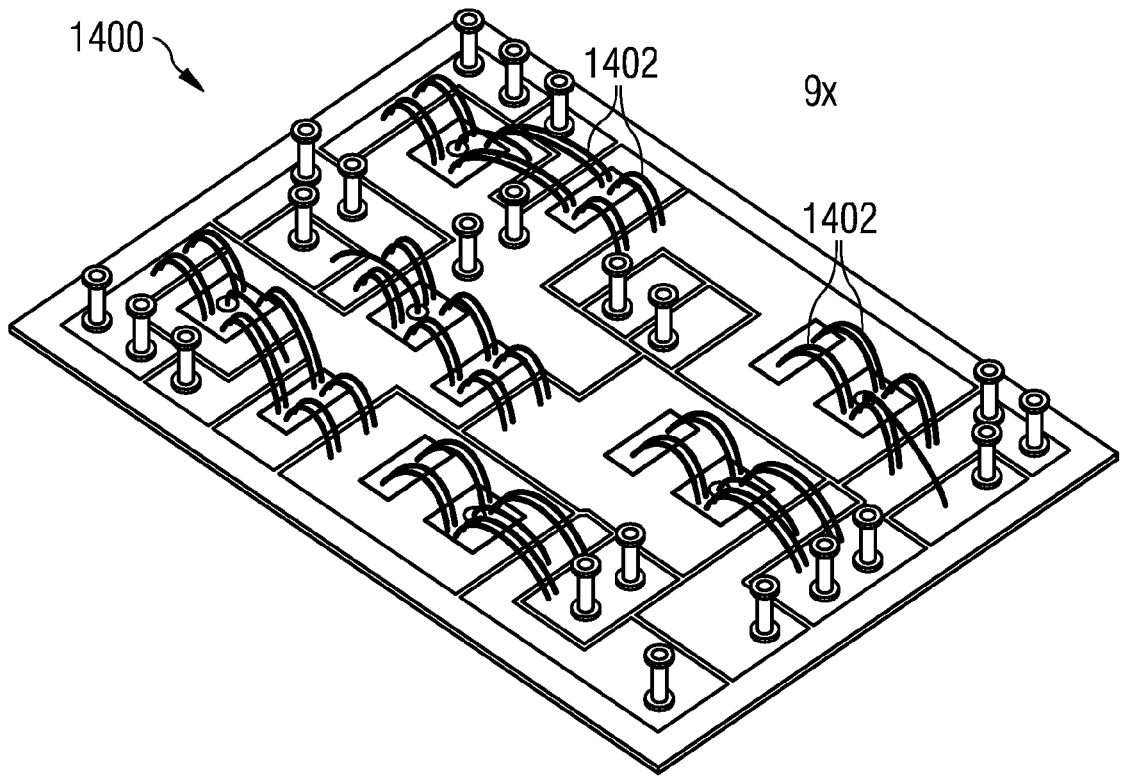
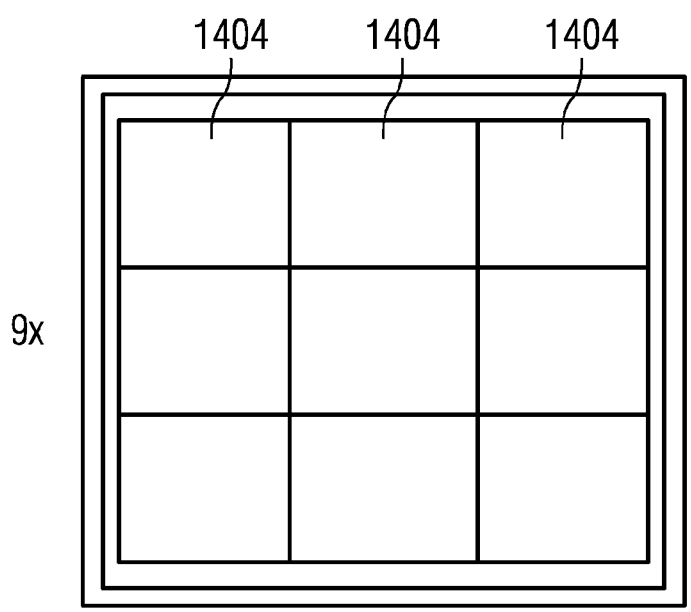

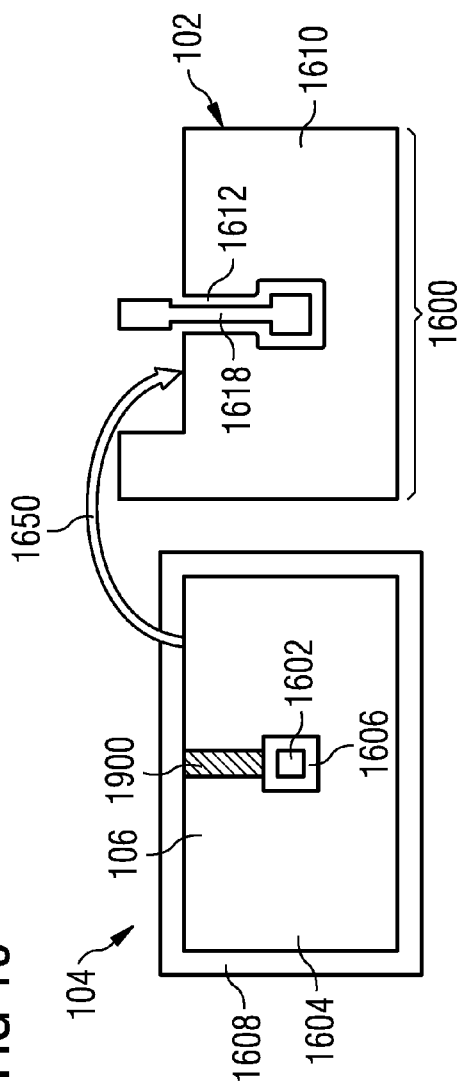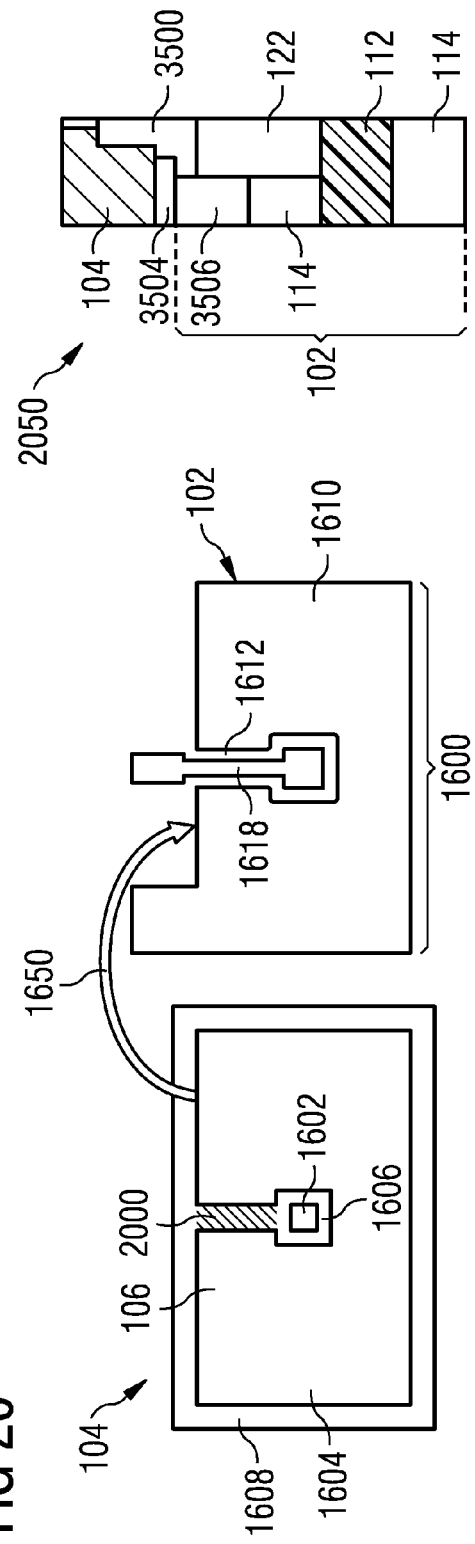

ELECTRONIC COMPONENT WITH SHEET-LIKE REDISTRIBUTION STRUCTURE

BACKGROUND

1. Technical Field

Various embodiments relate generally to electronic components, a method of manufacturing electronic components, and a semifinished product.

2. Description of the Related Art

A conventional electronic chip mounted on a chip carrier such as a lead frame, electrically connected by a bond wire extending from the chip to the chip carrier, and molded within a package may suffer from its thermal insulation within the package. Furthermore, such a conventional approach can reach its limits when complex electronic circuits involving multiple electronic chips shall be established. In particular the wiring of such electronic chips by multiple bond wires can involve shortcomings in terms of cooling efficiency and electronic artifacts resulting from the high inductance of bond wires.

In particular, conventional packages for power semiconductors use wire bond technology for contacting electronic chips (such as an insulated gate bipolar transistor chip, a freewheeling diode, etc.). Consequently, the casing and chip carrier construction are configured for a two-dimensional geometry.

SUMMARY

There may be a need to provide a possibility to manufacture electronic components with a simple processing architecture and with a high performance.

According to an exemplary embodiment, an electronic component is provided which comprises an electrically conductive chip carrier comprising an electrically insulating core structure at least partially covered with electrically conductive material, at least one electronic chip each having a first main surface attached to the chip carrier, and a sheet-like redistribution structure attached to a second main surface of the at least one electronic chip and configured for electrically connecting (in particular directly, i.e. without intermediate component, or indirectly, i.e. via one or more intermediate components) the second main surface of the at least one electronic chip with the chip carrier.

According to another exemplary embodiment, a method of manufacturing electronic components is provided, wherein the method comprises providing an electrically conductive chip carrier comprising an electrically insulating core structure at least partially covered with electrically conductive material, attaching a first main surface of a plurality of electronic chips to the chip carrier, attaching a sheet-like redistribution structure to a second main surface of the electronic chips, and configuring (for example by adding structures) the sheet-like redistribution structure for electrically connecting the second main surface of the electronic chips with the chip carrier.

According to yet another exemplary embodiment, an electronic component is provided which comprises an electrically conductive chip carrier comprising an electrically insulating core structure at least partially covered with electrically conductive material, a plurality of electronic chips each having a first main surface attached to the chip carrier, and a sheet-like redistribution structure attached to a second main surface of the plurality of electronic chips and configured for electrically connecting the second main surface of the plurality of electronic chips with the chip carrier, wherein the first main surface of a respective one of the plurality of electronic chips and/or a corresponding chip contact surface of the chip carrier is/are formed with such a surface configuration that a portion of the first main surface directly contacts a corresponding portion of the chip contact surface to provide for an electric contact and that another portion of the first main surface is arranged with regard to another portion of the chip contact surface, as a result of the surface configuration, so as to electrically decouple the other portions from one another.

According to yet another exemplary embodiment, an electronic component is provided which comprises an electrically conductive chip carrier comprising an electrically insulating core structure at least partially covered with electrically conductive material, a plurality of electronic chips each having a first main surface attached to the chip carrier, a sheet-like redistribution structure attached to a second main surface of the plurality of electronic chips and configured for electrically connecting the second main surface of the plurality of electronic chips with the chip carrier, and an electrically conductive spacer spacing the chip carrier from the at least one electronic chip and electrically connecting the chip carrier with at least one contact pad of the at least one electronic chip.

According to yet another exemplary embodiment, a semifinished product for use as a basis for forming a plurality of electronic components is provided, wherein the semifinished product comprises a plurality of electronic chips each having a first main surface and an opposing second main surface, and a sheet-like redistribution structure (which might provide for a substantially two-dimensional coupling with the electronic chip, and which may for instance be embodied as PCB, DCB, clip or singularized section of a metal foil) attached to the second main surface of the plurality of electronic chips so that the first main surface of the plurality of electronic chips remains at least partially exposed to be attached to a chip carrier, wherein the redistribution structure is configured as an electrically conductive sheet with a plurality of recesses each configured for accommodating a respective sub-group of the electronic chips, wherein the recesses are oblong trenches separated by oblong walls.

According to still another exemplary embodiment, an electronic component is provided, wherein the electronic component comprises at least one electronic chip each having a first main surface to be attached to an electrically conductive chip carrier, and a sheet-like redistribution structure comprising an electrically conductive sheet portion accommodating the at least one electronic chip at a second main surface of the at least one electronic chip and comprising a wall portion extending from the sheet portion up to a height level corresponding to the first main surface so that chip contacts on both main surfaces are electrically connectable to the chip carrier in a common connection plane defined by the first main surface and a free end of the wall portion.

Exemplary embodiments have the advantage that both opposing main surfaces of one or more electronic chips of the electronic components can be two-dimensionally contacted by the chip carrier and by the sheet-like redistribution structure (rather than by a thin bond wire). This improves the electric, thermal and mechanical properties of the package. The electric performance may be improved in view of a large flat contact area on both main surfaces (or contact surfaces) of the electronic chip resulting in a high ampacity, and an advantageously low inductance due to the possibility to omit bond wires and use a broader two-dimensionally contacting sheet-like redistribution structure (such as a layer portion of the redistribution structure contacting the second main surface of the electronic chip). The thermal performance may be improved in view of a large contact area on both sides of the electronic chip which promotes a double sided cooling and an efficient removal of heat generated during operation of the electronic component. Further, this enlarges the heat capacity against high electric pulses. Moreover, a reliable mechanical connection on both main surfaces may be obtained, and the electronic chips are safely shielded against an environment by two protective plate-like structures, i.e. chip carrier and redistribution structure.

DESCRIPTION OF FURTHER EXEMPLARY EMBODIMENTS

A gist of exemplary embodiments can be seen in that a robust three-dimensional integration of a semiconductor module, compatible with existing solutions, is rendered possible. This provides the opportunity to partition an arrangement to form multiple general-purpose submodules. Moreover, the packing density of electronic chips on the chip carrier may be increased as compared to a conventional two-dimensional solution. This can be accomplished by a vertical contacting rather than a horizontal contacting of electronic chips (such as an insulated gate bipolar transistor (IGBT) chip, a free-wheeling diode, etc.) on a chip carrier (such as a direct copper bonding substrate, DCB). As a vertical contacting element, a redistribution structure (for instance embodied as a clip) may be used which contacts simultaneously the chip carrier and the electronic chip or electronic chips. Hence, a submodule can be obtained which can be used for multiple purposes. The electronic chips and the redistribution structure may be mounted on the chip carrier (for instance by sintering or soldering), which may be followed by an encapsulating procedure (for instance molding or casting). By such an encapsulating procedure, the chip carrier may be embedded (for instance on five sides) into an electrically insulating mass (such as a mold compound or a silicone casting or a polyimide-based spray coating). The redistribution plane may be arranged above the electronic chips. Optional further procedures, such as mounting collets and/or applying soldering structures (such as solder balls) may be executed as well.

Such an architecture involves significant technical advantages. Advantageously, the volume consumption of electronic components (or packages) manufactured accordingly can be reduced, since contacts areas for conventionally used wire bonds on the chip carrier may be omitted and contact areas for collets may be shifted into the third dimension. Moreover, the described architecture allows to improve the electric performance of the electronic component. On the one hand, this architecture results in short connection paths. Due to the three-dimensional arrangement, the distance between a collet and an electronic chip can be rendered small, for instance by arranging the collet under the electronic chip on the redistribution structure. A distribution of several three-dimensional electronic chips in redistribution structures embodied as clip modules over the entire contact area of the chip carrier reinforces this effect. Moreover, the described architecture may result in an advantageously small value of the inductance. This results from a replacement of relatively long conventional bond wires (having a high value of the inductance) by compact three-dimensional connection elements (such as vias the like). Also the current carrying capability (or ampacity) of such an arrangement can be increased, since the propagation path towards the electronic chips has a low inductance (for instance when being embodied as copper layers of a DCB). The connection elements for contacting the electronic chips can be formed in a broad and thick way due to the large space offered by the redistribution layer or plane. Since the electronic chips may be contacted with a large contact area on both opposing main surfaces thereof, a double sided cooling may be accomplished which efficiently promotes the removal of heat generated during operation of the electronic component. Hence, also the thermal performance of the electronic component may be improved and is furthermore supported by a direct contact between chip pads (in particular a source pad of a transistor chip) and the chip carrier. Furthermore, the mechanical stability of the produced electronic components or packages may be significantly improved. For example, the chip carrier can be supported at edges and in a center (for instance by a pin) by a casing and can be pressed into position onto a cooling body. Each kind of pressure and/or bending load can be compensated by the chip carrier (in case of a DCB, this can be accomplished by the ceramic layer and the two copper layers). An encapsulant (such as a mold compound) above the chip carrier can be dimensioned so that it stabilizes the chip carrier. Moreover, electronic components according to the described architecture can be manufactured in a batch process and in a modular way which renders the manufacturing procedure highly efficient. For instance, a modular package may be formed with such a concept in which an IGBT and a diode are grouped to form a submodule, and multiple (for instance six) of such submodules can then be combined to a more complex module (for instance to a so-called six pack circuitry), optionally involving jumper collets or the like for contacting purposes. This allows to improve the manufacturing procedure and to reduce the material consumption (such as DCB area). A combination of such submodules can increase the yield of the manufacturing procedure.

A gist of an exemplary embodiment (see for instance FIG. 3 to FIG. 13) can be seen in that contact elements are soldered or sintered on a DCB. The active surface of IGBTs and/or diodes can then be connected in an electrically conductive way on these contact elements. A clip may then be attached on a back side of the diodes and the IGBTs as well as on the DCB to complete the wiring. This allows to provide a second wiring plane, to contact the IGBTs and the DCBs simultaneously, to improve the thermal properties by a direct source/DCB contact, and to accomplish a through contacting for collets, active electronics elements, etc. Such a power package formation concept is compatible also with conventional chip carrier concepts (for instance implementing collets with contact pins, etc.).

A gist of another exemplary embodiment (see for instance FIG. 16 to FIG. 24) can be seen in that IGBTs and diodes are firstly contacted on a planar surface of a DCB. A PCB may then be in used to provide a second wiring plane, to contact the IGBTs and the DCB simultaneously, to improve the thermal properties (for instance when implementing thick copper PCBs), and to accomplish a through contacting for collets, active electronics elements, etc. In a similar way, it is also possible that IGBTs and diodes are firstly contacted on a planar surface of a PCB. A DCB may then be in used to provide a second wiring plane, to contact the IGBTs and the DCB simultaneously, to improve the thermal properties, and to accomplish a through contacting for collets, active electronics elements, etc. Such a power package formation concept is compatible also with conventional chip carrier concepts (for instance implementing collets with contact pins, etc.). Moreover, such an embodiment provides power packages formed of two chip carriers and allowing for a continuous three-dimensional integration (for example contact areas above the collets).

A gist of still another exemplary embodiment (see for instance FIG. 25 to FIG. 36) can be seen in that IGBTs and diodes are contacted in a planar manner on a linear patterned metal foil. Obtained submodules are then isolated in a structured manner and are provided with a contact medium on the contact surfaces, before singularising them to module clips. Alternatively, the described procedure can also be performed without isolation. Such modules may be used to constitute a more complex circuitry (such as a six pack) on the DCB. The obtained module in clip allows to provide the second wiring plane, a contacting of IGBTs and DCB simultaneously, to improve the heat coupling by a direct source/DCB contact, and to provide through contacts for employing collets or other active elements. Such a power package formation concept is also compatible with conventional chip carrier concepts (for instance implementing collets with contact pins, etc.). Moreover, such an embodiment provides power packages formed of two chip carriers and allowing for a continuous three-dimensional integration (for example by providing contact areas above the collets). Furthermore, power packages formed of a DCB and such submodules can be directly used for SMT (surface mounting technology).

In an embodiment, the chip carrier comprises an electrically insulating core structure (for instance a central sheet-like structure, for example made of a ceramic material, a glass fiber material and/or a polymer material) at least partially covered with electrically conductive material. The electrically insulating core structure may be covered with the electrically conductive material only on one main surface thereof, or on both opposing main surfaces thereof. In one embodiment, the chip carrier is a printed circuit board (PCB). In another embodiment, the chip carrier is a DCB or DAB substrate.

In an embodiment, at least one of the group consisting of the chip carrier and the redistribution structure is configured as a printed circuit board (PCB). Such a PCB may comprise an electrically insulating substrate (for instance made of FR4 material) covered with a patterned layer of electrically conductive material (for instance made of copper material). Hence, the redistribution structure may be configured as a second chip carrier.

In an embodiment, the chip carrier is configured as an electrically insulating and thermally conductive substrate having two opposing main surfaces each covered with an electrically conductive structure. This substrate may for instance be made of a ceramic material covered with copper, aluminum, etc., on both opposing main surfaces of the substrate. In particular, the chip carrier may be configured as one of the group consisting of a direct copper bonding (DCB) substrate, and a direct aluminium bonding substrate (DAB). Such a substrate provides a proper basis for an efficient removal of heat via a cooling structure which may be mounted directly on one electrically conductive layer on the substrate. The opposing electrically conductive layer may be used for wiring purposes. DCB and DAB substrates are commercially available and therefore allow for a cost efficient solution of the mounting and cooling issues. Large DCB and DAB substrates are particularly appropriate for a batchwise production of electronic components.

In an embodiment, the redistribution structure is configured as an electrically conductive sheet portion for accommodating the at least one electronic chip and a wall portion (which may be integrally formed with the sheet portion or which may be alternatively formed separately from but connected to the sheet portion) being configured for being connected with the chip carrier when the at least one electronic chip is connected to the chip carrier. The sheet portion and the wall portion may be arranged perpendicular to one another. The sheet portion and the wall portion may together form a chip accommodation cavity or volume. They may be formed as a section of a frame like sheet having trenches or blind holes for chip accommodation and being separable into multiple sheets/wall sections, each for a respective electronic component or package. Thus, the described architecture is compatible with an efficient batch procedure.

In an embodiment, the redistribution structure is configured as one of the group consisting of one continuous clip structure, and a plurality of separate clips or clip structures. A clip may be a bent or angled structure directly connecting an upper surface of the electronic chip with an upper surface of the chip carrier which accommodates, in turn, a lower surface of the chip.

In an embodiment, at least a part of the electronic chips is mounted on the chip carrier in a flip chip configuration. More specifically, attaching the redistribution structure to the second main surface of the electronic chips may be performed before attaching the first main surface of the electronic chips to the chip carrier, wherein the electronic chips attached to the redistribution structure may be turned upside down (to accomplish the flip chip geometry) before attaching them to the chip carrier. In this context, the term "flip chip" arrangement may denote that an active surface of the respective electronic chip (for instance comprising source pad and gate pad of a transistor chip) is arranged on a bottom side rather than on the top side of the electronic component, and may be connected to the chip carrier rather than to the redistribution structure.

In an embodiment, at least part of the electronic chips may be configured as semiconductor power chip. In particular, at least part of the electronic chips may comprise at least one of the group consisting of a diode, in particular a freewheeling diode, and a transistor, in particular a field effect transistor or a bipolar transistor, more particularly a metal oxide semiconductor field effect transistor (MOS-FET) or an insulated gate bipolar transistor (IGBT). The efficient heat removal accomplished by the double sided cooling of the chip due to the two-dimensional contact between electronic chip and both chip carrier and sheet-like redistribution structure is of particular advantage for power packages where heat removal is a bottleneck.

In an embodiment, the redistribution structure comprises at least one recess. Such a recess may be embodied as a through hole in the redistribution structure or as a free space between two separate sub-structures of the redistribution structure. Only a lateral protrusion of the chip carrier over the redistribution structure may be considered as such a recess.

In an embodiment, the electronic component further comprises at least one electronic element extending from the chip carrier and extending through the at least one recess. Such an electronic element may be selected from a group consisting of a capacitance, an inductance, a coil, an ohmic resistance, and an electrically insulating collet having a hole for accommodating an electrically conductive contact. Thus, free space within the electronic component may be used for accommodating such additional electronic components which renders the latter particularly compact.

In an embodiment, the first main surface of a respective one of the at least one electronic chip and/or a corresponding chip contact surface of the chip carrier is formed with such a surface configuration (for instance height profile or material composition) that—when attaching the electronic chip to the chip carrier—a portion of the first main surface directly contacts a corresponding portion of the chip contact surface to provide for an electric contact and that another portion of the first main surface is arranged with regard to another portion of the chip contact surface as a result of the surface configuration so as to electrically decouple the other portions from one another. By correspondingly configuring cooperating surfaces of the chip carrier and the electronic chip, it is possible to realize at the same time a basically full-face contacting of both surfaces and a contacting of multiple pads on these surfaces while at the same time meeting the requirements to electrically decouple specific pads from one another in a safe way.

In an embodiment, the surface configuration is a height profile of the respective surface which is formed so that—when attaching the electronic chip to the chip carrier—the other portions are spaced with regard to one another as a result of the height profile. In an embodiment, the method correspondingly comprises processing (such as etching or milling) at least one of the first main surface of a respective one of the electronic chips and a corresponding chip contact surface of the chip carrier with such a surface height profile that a portion of the first main surface directly contacts a corresponding portion of the chip contact surface to provide for an electric contact and that another portion of the first main surface is spaced with regard to another portion of the chip contact surface as a result of the etching so as to electrically decouple the other portions from one another. For instance, this can be accomplished by locally removing material from a planar electrically conductive layer on the first main surface and/or on the chip contact surface so as to selectively decouple, with a bridge like geometry, specific portions of the contacting surfaces from one another.

Additionally or alternatively, the surface configuration may be a distribution of electrically conductive and electrically insulating sections of the respective surface which is formed so that—when attaching the electronic chip to the chip carrier—the other portions are electrically decoupled with regard to one another as a result of the electrically insulating sections. In such an embodiment, it is possible to achieve selective electric coupling and selective electric decoupling of specific portions of the contacting surfaces of electronic chip and chip carrier without the need to form a height profile, merely by forming an alternating sequence of electrically conductive portions and electrically insulating portions.

In an embodiment, the respective first main surface comprises a central electrically conductive contact zone and a surrounding electrically conductive zone electrically decoupled from one another by an annular electrically insulating zone. If the corresponding electronic chip is a transistor chip, the central electrically conductive contact zone may be a gate contact, whereas the surrounding electrically conductive zone may be a source pad. The respective chip contact surface may comprise a strip like electrically conductive contact zone and a strip surrounding electrically conductive contact zone decoupled from one another by an intermediate electrically insulating zone, wherein the central electrically conductive contact zone is electrically coupled with the strip like electrically conductive contact zone and the surrounding electrically conductive zone is electrically coupled with the strip surrounding electrically conductive contact zone. This may allow to provide for a large area source contact, whereas a reliably insulated gate contact can be provided on the same chip surface without losing the possibility to provide for a basically full-faced contact between the electronic chip and the chip carrier.

In an embodiment, the electronic component further comprises a height distance compensation structure mechanically and electrically connecting the redistribution structure to the chip carrier by bridging a gap between the redistribution structure and the chip carrier. In an embodiment, the method correspondingly comprises mechanically and electrically connecting the redistribution structure to the chip carrier by forming a height distance compensation structure bridging a gap between the redistribution structure and the chip carrier. In particular, the method may comprise forming the height distance compensation structure as electrically conductive structures, in particular as solder structures, formed on the redistribution structure. The method may comprise forming the height distance compensation structure as electrically conductive structures connected to the chip carrier, in particular connected simultaneously with a connecting of the electronic chips on the chip carrier. Various embodiments for such a height distance compensation structure are possible. In one embodiment, dedicated solder structures may be implemented for this purpose on a printed circuit board (constituting the chip carrier or the redistribution structure). It is also possible, when sintering the electronic chips to the chip carrier, to also sinter electrically conductive posts for contact to the redistribution structure (for instance embodied as a PCB). In yet another embodiment, stud bumps may be formed on the chip carrier to allow leveling. In still another embodiment, a ribbon bond may be formed on a DCB (as chip carrier) to provide for a contact with the redistribution structure (which, again, may be embodied as a PCB).

In an embodiment, the electronic component further comprises an encapsulant at least partially encapsulating the at least one electronic chip and the redistribution structure, and optionally also the chip carrier. In an embodiment, the method may correspondingly comprise at least partially encapsulating the electronic chips and the redistribution structure by an encapsulant. Such an encapsulant mechanically protects the elements within the electronic component or package. The encapsulant may be made of a thermally conductive material to also contribute to the removal of heat generated during operation of the electronic component.

In an embodiment, the method comprises forming the encapsulant by at least one of the group consisting of molding, spray coating, casting, laminating, and applying a polymer-based material. Also a combination of two or more of these or other procedures for forming an encapsulant is possible. Such procedures may be carried out sequentially.

In an embodiment, the method comprises forming the encapsulant by executing a first encapsulating procedure before electrically connecting the chip carrier with the redistribution structure, and by executing a second encapsulating procedure after electrically connecting the chip carrier with the redistribution structure. For instance, a first encapsulating procedure may fill free gaps between chip carrier, electronic chip or chips and redistribution structure. A second encapsulating procedure may then be carried out to at least partially cover the redistribution structure. For example, the first encapsulating procedure comprises one of the group consisting of applying a polymer-based material, spray coating, and casting. For instance, the second encapsulating procedure comprises one of the group consisting of molding, spray coating, casting, and laminating.

In an embodiment, the encapsulating is performed so that the encapsulant has at least one hole. Such one or more hole may be a through hole, a blind hole, etc. It may serve for accessing elements in an interior of the electronic component being encapsulated by the encapsulant. It is possible to form the hole (for instance by drilling, laser processing, etching, etc.) after formation of the encapsulant. Alternatively, such a hole may also be formed during formation of the encapsulation, for instance by film assisted molding.

In an embodiment, the method further comprises guiding, in particular press fitting, at least one electrically insulating collet having a hole for accommodating an electrically conductive contact through the at least one hole in the encapsulant. Correspondingly, the electronic component may further comprise at least one electrically insulating collet having a hole for accommodating an electrically conductive contact and extending from the chip carrier and through the encapsulant so as to provide an external access hole for inserting the electrically conductive contact. Such collets (or sleeves) to later receive an electrically conductive contact (such as an electrically conductive pin) allow to form contacts to contact the electronic chip either directly or indirectly via the chip carrier.

In an embodiment, at least a part of the encapsulating procedure is performed after connecting at least one electrically insulating collet having a hole for accommodating an electrically conductive contact with the chip carrier. This advantageously prevents the need to form access holes in the encapsulation for inserting the collets into the encapsulant. An appropriate measure should be taken to avoid the hole of the collet to be filled with encapsulant material during the encapsulation procedure. For instance, the collets may be temporarily filled with a removable dummy during the encapsulation procedure, or they may be equipped with a membrane or the like to be protruded later by the electrically conductive contact and preventing encapsulant material to enter the hole during the encapsulation procedure.

In an embodiment, the electronic component further comprises the at least one electrically conductive contact each extending through the hole of a respective one of the electrically insulating collets and extending beyond the encapsulant. Such electrically conductive contacts may be pins.

In an embodiment, the method comprises inserting at least one solder structure, in particular at least one solder ball, into and extending beyond the at least one hole in the encapsulant. Such a solder ball may serve as a connection structure for an electronic periphery structure to be connected with the electronic component, for instance on a customer side. By slightly protruding over a surface of the electronic component, the solder structure may provide for an electric connection with the electronic periphery structure by simply attaching it to the electronic component.

In an embodiment, the electronic component further comprises a heat removal body being thermally connected to the chip carrier (or, additionally or alternatively, thermally connected to the redistribution structure) and being configured for removing heat generated during operation of the electronic component. Hence, also the optional attachment of a cooling body to an exterior surface of the chip carrier and/or redistribution structure is possible by the architecture according to an exemplary embodiment. Such a heat removal body or heat dissipation body may have very different shapes. For example, it may be a plate of a properly thermally conductive body, such as copper or aluminium, which may have cooling fins or the like to further promote dissipation of heat which can be thermally conducted from the electronic chip via the chip carrier to the heat dissipation body. The removal of the heat via the heat dissipation body may further be promoted by a cooling fluid such as air or water (more generally a gas and/or a liquid) which may flow along the heat dissipation body externally of the electronic component.

In an embodiment, the electronic component further comprises at least one further electronic chip, in particular at least one control chip and/or logic chip, being mounted on a surface of the chip carrier opposing another surface of the chip carrier on which other surface the at least one electronic chip is mounted. Therefore, advantageously both main surfaces of the chip carrier may be used for mounting electronic chips thereon. For example, one side may be used for mounting semiconductor power chips, whereas the opposing other side may be used for mounting control chips and/or logic chips.

In an embodiment, the electronic component further comprises an electrically conductive patterned spacer layer, in particular comprising a plurality of electrically decoupled electrically conductive islands, spacing the chip carrier with regard to the at least one electronic chip and electrically connecting specific portions of the chip carrier with contact pads of the at least one electronic chip. Such a patterned spacer layer, which may be formed by depositing or attaching an electrically conductive layer and patterning the latter by a lithography procedure and an etching procedure, can be formed with reasonable effort and very small space consumption and allows to realize any desired wiring connection between chips and redistribution structure. Synergetically, it also serves as a mechanical spacer.

In an embodiment, at least a part of the at least one electronic chip comprises an electrically insulating side edge cover (for instance made of a plastic material such as polyimide, and for instance circumferentially covering all sides of the electronic chip) covering selectively at least a part of the side edge (and optionally also an adjacent bottom surface portion) of the respective electronic chip and functioning as voltage breakthrough protection. Such side edge covers, which may have a basically L-shaped cross section, may cover a portion of a main surface and a directly juxtaposed portion of a side surface of the electronic chip so as to improve the breakthrough strength voltage of the electronic component.

In an embodiment, the electronic component comprises a plurality of electronic chips which comprise six pairs of insulated gate bipolar transistors (IGBTs) and freewheeling diodes, wherein two pairs each are circuited in series, the serial pairs being circuited in three parallel electronic paths. A corresponding circuitry is shown schematically in FIG. 6. Such a so-called six pack may form a power module (for instance for hybrid electrical vehicle applications), for instance for a power range up to 30 kW. Such a module may accommodate a six pack configuration of IGBIs and matching emitter controlled diodes and may, for instance, operate up to 400A/650V. Such a circuitry is operable with very low conduction and switching losses.

In an embodiment, the method comprises forming at least one of the group consisting of the chip carrier and the redistribution structure as an electrically conductive sheet which is processed, in particular milled or etched, for forming a plurality of recesses configured for accommodating the electronic chips. More particularly, the recesses are formed, in particular by milling or etching, as oblong trenches (for instance aligned parallel to one another) separated by oblong walls and each being configured for accommodating a plurality of the electronic chips. For instance, an aspect ratio (i.e. a ratio between length and width) of the trenches may be at least five, in particular at least ten. Thus, multiple sets of electronic chips may be located in one trench, each set (for instance constituted by an IGBT and a diode) being assigned to a corresponding submodule, wherein one or more submodules may be combined to an electronic component. Additionally, the method may further comprise accommodating the electronic chips batchwise in the trenches of the sheet. For example, a thin metal foil may be made subject of a patterning procedure (for instance by carrying out a lithography and etching procedure, or a milling procedure) so as to form a height profile (for instance a rectangular profile). In valleys or recesses of the resulting structure, chips may be mounted in a batch process. Before or after connecting the resulting arrangement of processed electrically conductive sheet and accommodated electronic chips to a chip carrier, the arrangement may be singularized into sections (which may also de denoted as submodules) each comprising one or more electronic chips and an assigned portion of the patterned foil.

In an embodiment, the entire first main surface of the electronic chips is full-faced connected to the chip carrier. In other words, substantially the entire first main surface of the electronic chip may be in direct contact with the chip carrier. Moreover, the entire second main surface of the electronic chips may be full-faced connected to the redistribution structure. In other words, substantially the entire second main surface of the electronic chip may be in direct contact with the redistribution structure. Therefore, a high contact area is formed between chip and upper and/or lower contact plane which is advantageous in terms of both the electrical performance (high ampacity, small inductance, reliable electric contact) and thermal properties (i.e. removal of heat via a large thermal coupling area, in particular by a double sided cooling architecture).

In an embodiment, a material and dimensions of the redistribution structure are configured so that thermal expansion characteristics of the redistribution structure match with thermal expansion characteristics of the electronic chips and with chip connections (i.e. electric traces electrically coupling the electronic chip(s) to the electric environment). This allows to maintain the mechanical integrity of the electronic component with changing temperatures, and allows the use of the electronic component over a wide temperature range.

In an embodiment, the method further comprises singularizing the arrangement of chip carrier, electronic chips and redistribution structure into multiple electronic components each of which comprising at least a section of the chip carrier, at least one of the electronic chips and at least a section of the redistribution structure. In many cases, also a section of an encapsulant forms part of each of the singularized electronic components or packages. Hence, a large portion of the manufacturing process may be carried out batchwise followed by a singularization, which allows for a rapid and efficient production of the electronic components on an industrial scale.

In an embodiment, the method further comprises connecting an exposed portion of the redistribution structure to an electronic periphery component, in particular a printed circuit board. Such an embodiment is shown in FIG. 36.

In one embodiment, the redistribution structure of the electronic component is made at least partially from a deformable (in particular flowable) material. This allows the electronic component to perform small balancing motions, for instance in case of thermal expansion. For example, the redistribution structure may be made of plated copper, copper having weakening contribution or being attached to a softer metal.

In one embodiment, the method comprises carrying out the encapsulating after having connected the redistribution structure with the chip carrier. This allows to completely fill out all gaps between the individual components.

In one embodiment, the procedure of attaching the first main surface of the plurality of electronic chips to the chip carrier and/or of attaching the sheet-like redistribution structure to the second main surface of the electronic chips comprises:
   applying (for instance printing) a sinter material on a substrate (such as a foil);
   optionally pre-drying the applied sinter material on the substrate;
   configuring respective main surfaces of the electronic chips to have a surface profile (for instance, chip pads of the electronic chips may protrude beyond other surface portions to thereby form the surface profile);
   contacting the applied sinter material on the substrate with the respective main surfaces having the surface profile so that the applied sinter material selectively adheres to elevated portions (such as the aforementioned chip pads) of the respective main surfaces of the electronic chips having the surface profile;
   carrying out the attaching by the adhering sinter material on the elevated portions of the respective main surfaces of the electronic chips (particularly so that the adhering sinter material provides for a connection between the respective main surface of the respective electronic chip and the chip carrier/redistribution structure).

Thus, sinter material (such as sinter paste) may be applied to the respective main surface of the electronic chip indirectly by a transfer procedure making use of a substrate with pre-applied sinter material which only transfers the sinter material to those portions of the main surfaces of the electronic chips, which portions protrude over other portions of the main surface. Thus, a procedure of patterning sinter material may become dispensable.

In one embodiment, the electronic chips may be used as sensors or actuators in microelectromechanical systems (MEMS), for example as pressure sensors or acceleration sensors. In another embodiment, the electronic chips may be used as semiconductor chips for power applications for instance in the automotive field and may for instance have at least one integrated insulated-gate bipolar transistor (IGBT) and/or at least one integrated diode. In an embodiment, at least one electronic chip may be a logic IC or an electronic chip for RF power applications.

As substrate or wafer for forming the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. For the packaging, moulding or encapsulation, a plastic material or a ceramic material may be used. Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

FIG. 2 show a cross-sectional view of an electronic components according to another exemplary embodiment.

FIG. 14 shows a conventional electronic component and FIG. 15 shows an electronic component according to an exemplary embodiment, wherein the comparison of FIG. 13 with FIG. 14 shows the improved compactness obtainable with the exemplary embodiment.

FIG. 19 shows, on the left-hand side, a plan view of a first main surface of an electronic chip with a locally reduced thickness and, on the right-hand side, a correspondingly configured chip contact surface of a chip carrier of an electronic component according to an exemplary embodiment.

FIG. 20 shows, on the left-hand side, a plan view of a first main surface of an electronic chip with a local electrically insulating region and, on the right-hand side, a correspondingly configured chip contact surface of a chip carrier of an electronic component according to an exemplary embodiment.

DETAILED DESCRIPTION OF EXEMPLARY EMBODIMENTS

Figure 1A:
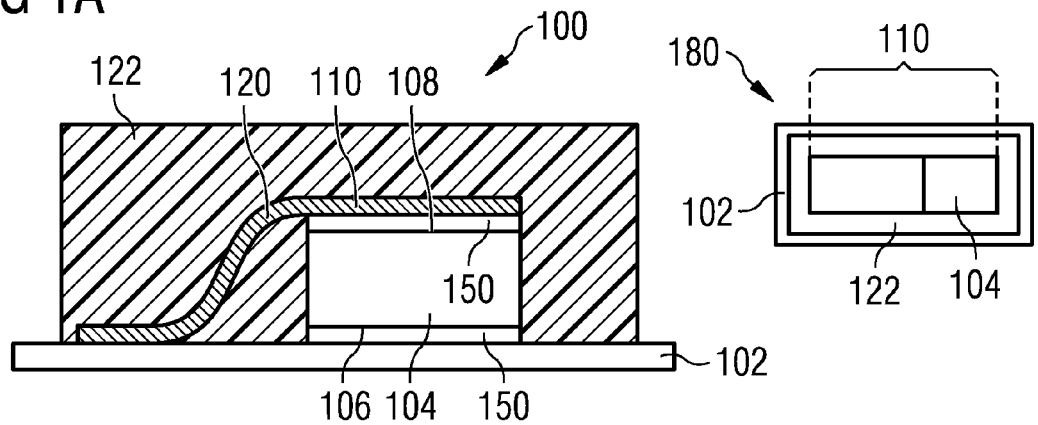
FIG. 1A to FIG. 1C show cross-sectional views of electronic components according to exemplary embodiments.

The illustration in the drawing is schematically and not to scale.

Figure 1B:
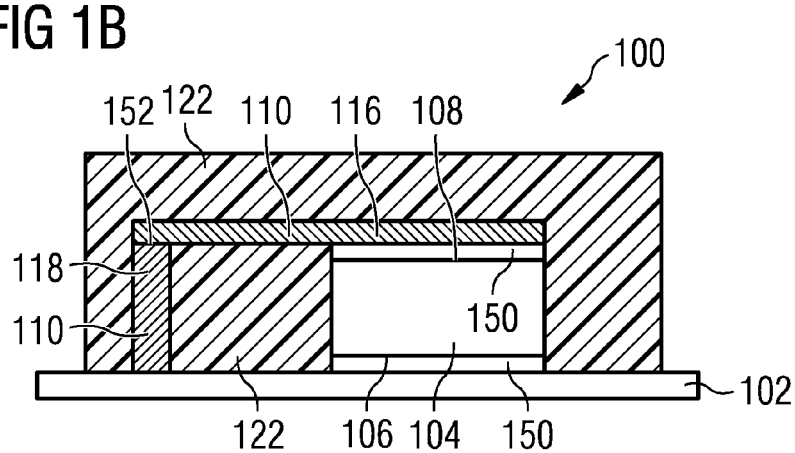
Figure 1C:
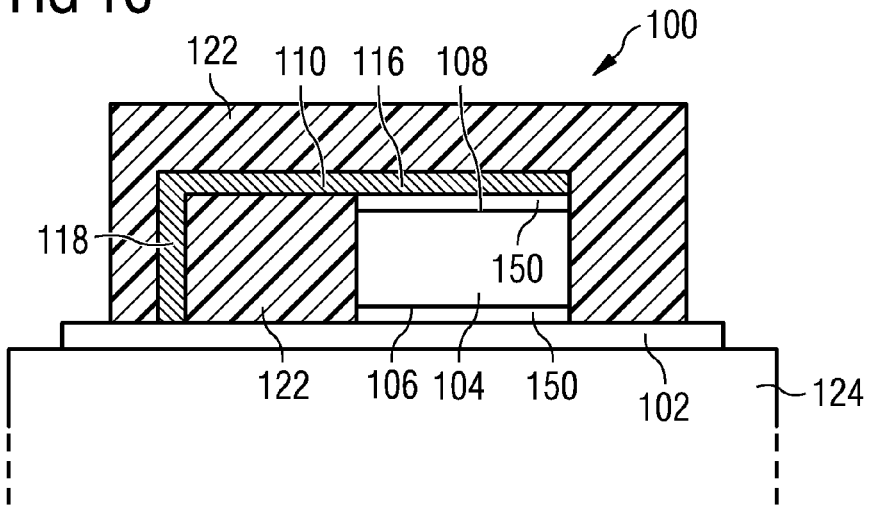

FIG. 1A to FIG. 1C show cross-sectional views of electronic components 100 according to exemplary embodiments.

FIG. 1A shows a cross sectional view of an electronic component 100 according to an exemplary embodiment which comprises an at least partially electrically conductive chip carrier 102 (embodied as a printed circuit board, PCB), an electronic chip 104 (embodied as a semiconductor power chip) having a first main surface 106 attached to the chip carrier 102 (via a thin chip pad 150), and an at least partially electrically conductive sheet-like redistribution structure 110 (embodied as a clip, i.e. a bent solid strip or ribbon), attached to a second main surface 108 of the electronic chip 100 (via another thin chip pad 150) and configured for electrically connecting the second main surface 108 of the electronic chip 104 with the chip carrier 102. The thin chip pads 150 are formed on both main surfaces 106, 108 of the electronic chip 104, i.e. between the electronic chip 104 and the chip carrier 102 and between the electronic chip 104 and the redistribution structure 110. Furthermore, an encapsulant 122, here embodied as a mold structure, encapsulates the electronic chip 104, the redistribution structure 108, the chip pads 150 and also covers a part of the chip carrier 102. As can be taken from a plan view 180 of FIG. 1A, the redistribution structure 110 embodied as a clip covers the entire second main surface 108 of the electronic chip 104 and therefore, in combination with the chip carrier 102 covering the entire first main surface 106, provides for a basically full-face electric contact on both opposing main surfaces 106, 108 of the electronic chip 104. The plan view 180 of the electronic chip 100 shows that the bent clip as redistribution structure 110 has a two-dimensional or sheet-like shape.

FIG. 1B shows an electronic component 100 according to another exemplary embodiment which differs from the embodiment of FIG. 1A particularly in that the redistribution structure is here embodied as a combination of a horizontal sheet portion 116 and a vertical wall section 118. The sheet portion 116 and the wall section 118 are embodied as two separate structures which are connected to one another at a connection portion 152, for instance by soldering, sintering or gluing, to form together a basically L-shaped structure.

FIG. 1C shows an electronic component 100 according to still another exemplary embodiment which differs from the embodiment of FIG. 1B particularly in that the sheet portion 116 and the wall section 118 are here formed as an integral structure being also basically L-shaped in the cross-sectional view of FIG. 1C. It can furthermore be seen in FIG. 1C that an optional heat removal body 124 is mechanically and thermally connected (for instance attached, glued, soldered or screwed) to the chip carrier 102 and is configured for removing heat generated during operation of the electronic component 100.

FIG. 2 show a cross-sectional view of an electronic component 100 according to another exemplary embodiment.

In this embodiment, four electronic chips 104 are mounted on a chip carrier 102 which is here embodied as a DCB (direct copper bonding) substrate constituted by an electrically insulating and thermally conductive substrate 112 (here embodied as a ceramic plate) which has electrically conductive structures 114 (here embodied as patterned copper layers) on both of its opposing two main surfaces. On the upper one of the two electrically conductive structures 114, the first main surfaces 106 of the electronic chips 104 are attached. An electrically conductive plate constitutes multiple sheet portions 116, and vertically extending posts of electrically conductive material form the wall portions 118 of the redistribution structure 110. The sheet portions 116 cover the full area of the second main surfaces 108. Gaps between the electronic chips 104, the chip carrier 102 and the redistribution structure 110 are filled with an encapsulant 122 (such as a mold compound), which also covers exposed upper surfaces of the redistribution structure 110.

Electronic elements, constituted by electrically insulating hollow cylindrical collets 202 (if appropriate, they may also be made of an electrically conductive material) having a hole and by electrically conductive contacts 204 (such as pins) extending through the hole, are located in gaps or recesses 200 formed in the encapsulant 122 and in the redistribution structure 110. Lower end portions of the electrically conductive contacts 204 contact the upper electrically conductive structures 114 of the chip carrier 102 and therefore provide an external electric contact to the lower surface of the electronic chips 104.

Further recesses 154 can also be filled with appropriate electronic elements, such as capacitances, inductances, coils, ohmic resistances, etc., to further refine the electronic performance of the electronic component 100 and to further improve its compactness.

Furthermore, it is possible that a heat removal body 124 is attached to the lower surface of the chip carrier 102 to promote heat dissipation.

Figure 3:
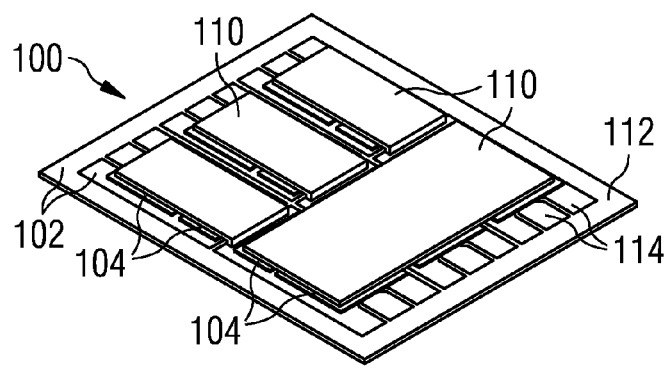
FIG. 3 shows a three-dimensional view of an electronic component according to an exemplary embodiment.
Figure 4:
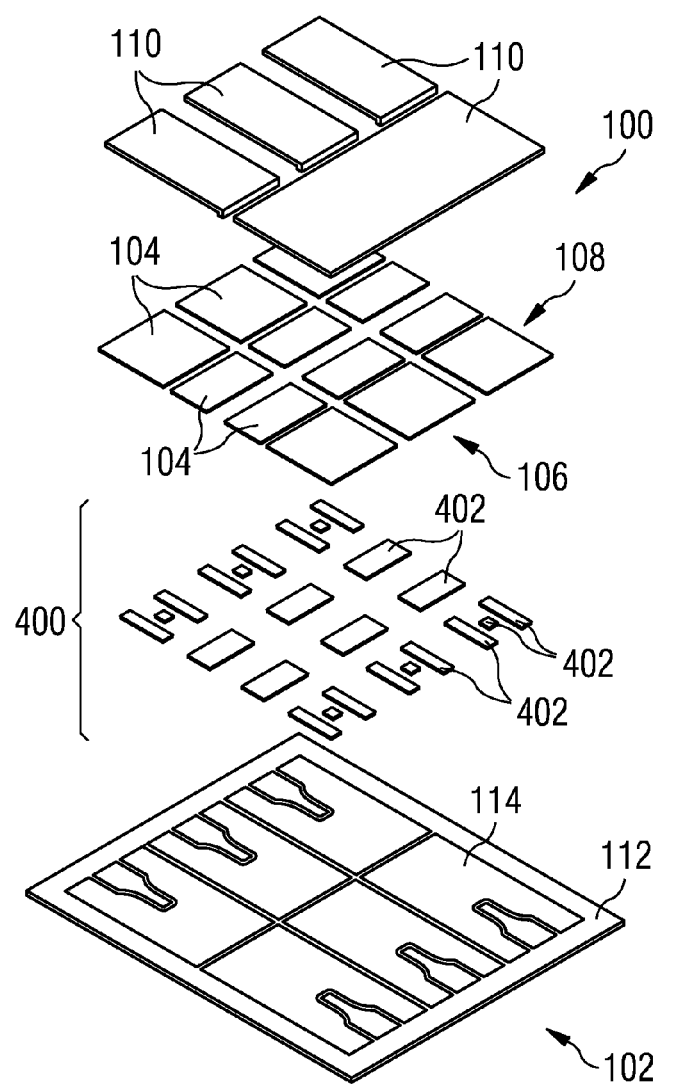
FIG. 4 shows an explosive view of the electronic component of FIG. 3.
Figure 5:
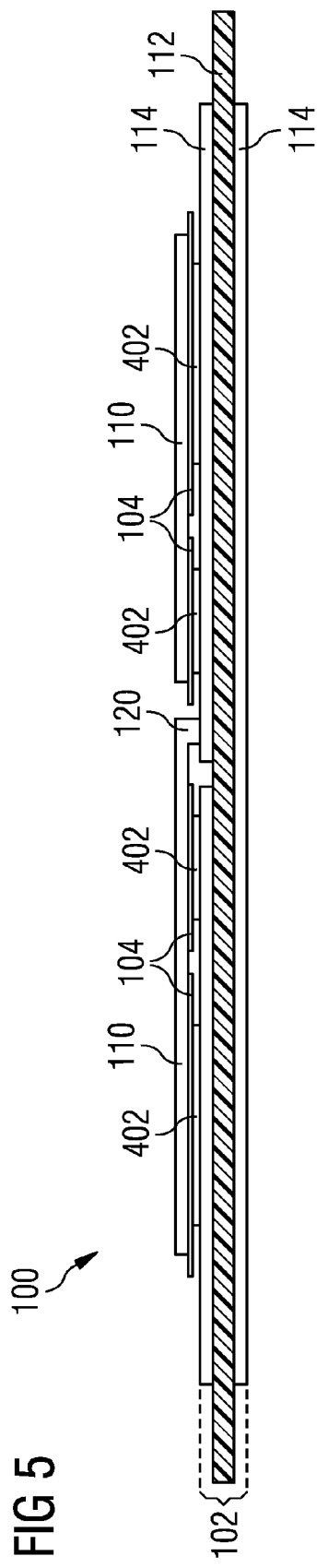
FIG. 5 shows a cross-sectional view of the electronic component of FIG. 3.

FIG. 3 shows a three-dimensional view of an electronic component 100 according to an exemplary embodiment. FIG. 4 shows an explosive view of the electronic component 100 of FIG. 3. FIG. 5 shows a cross-sectional view of the electronic component 100 of FIG. 3.

In the embodiment of FIG. 3 to FIG. 5, chip carrier 102 is constituted as a DCB substrate, and redistribution structure 110 is constituted as four clips. Directly above the chip carrier 102, an electrically conductive patterned spacer layer 400 constituted by a plurality of electrically conductive islands 402 (electrically decoupled from one another) is provided which spaces the chip carrier 102 from the electronic chips 104 and which electrically connects specific portions of the chip carrier 102 with contact pads of the electronic chips 104. The electrically conductive islands 402 serving as spacer and contact elements prevent a short-circuiting between gate pads and source pads of the electronic chips 104 which are configured as transistor chips and provide for a contact between chip carrier 102 and redistribution structure 110.

As can be taken from the explosive view of FIG. 4, the electronic chips 104 are paired, wherein the larger electronic chip 104 of each pair comprises an insulated gate bipolar transistor and the smaller electronic chip 104 of each pair indicates a freewheeling diode.

Figure 6:
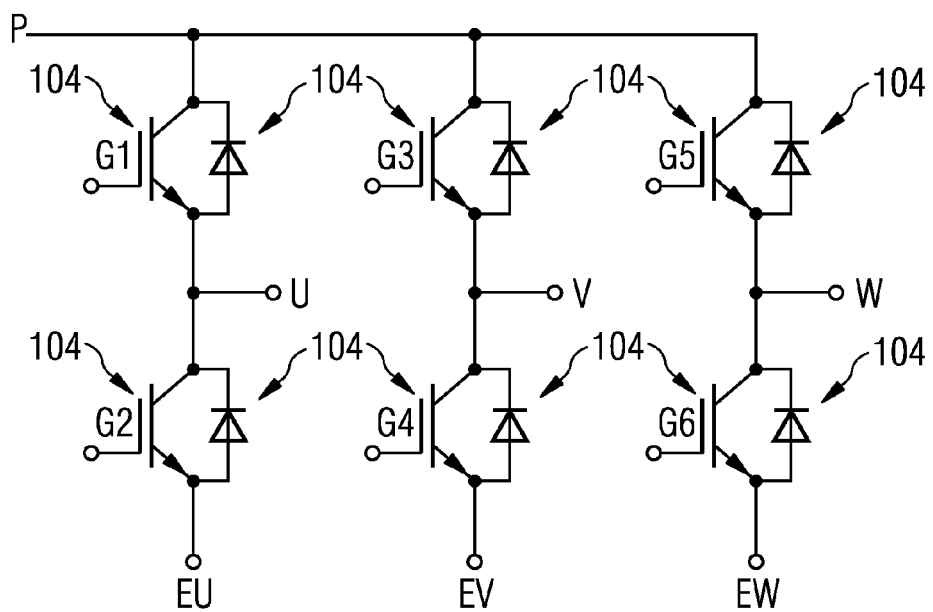
FIG. 6 shows an electronic circuit of six freewheeling diodes and six insulated gate bipolar transistors of the electronic component of FIG. 3.
Figure 7:
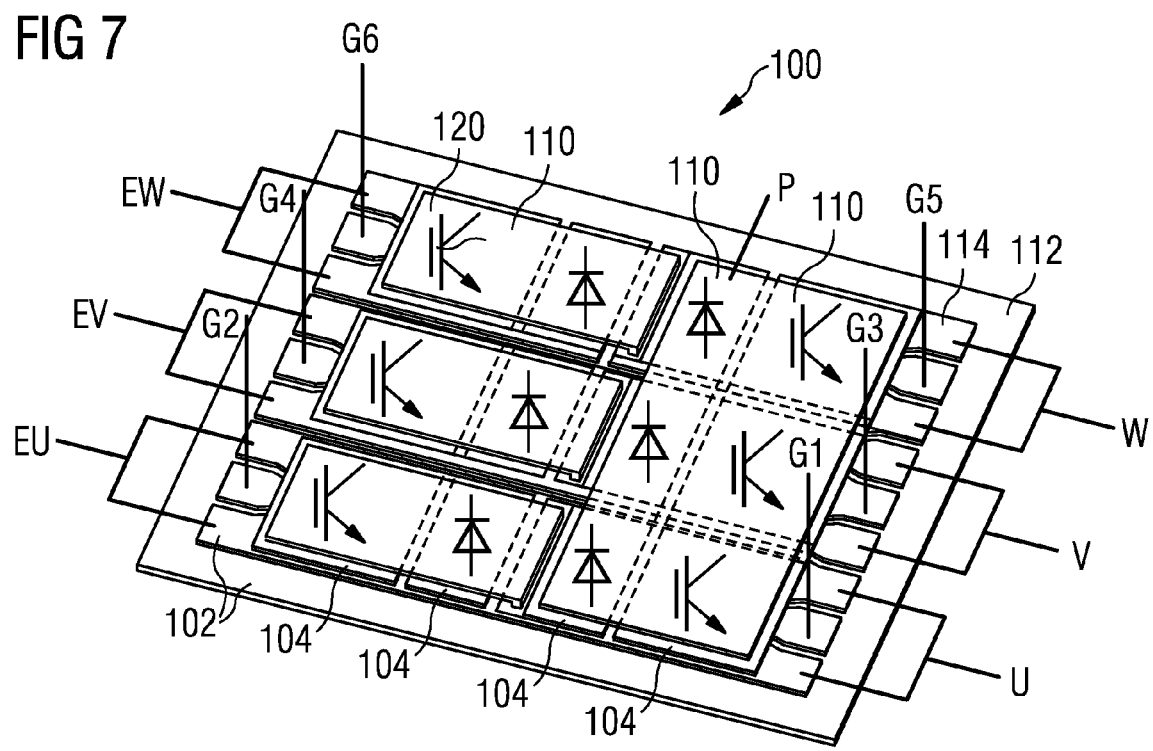
FIG. 7 shows a three-dimensional view of the electronic component of FIG. 3 illustrating the diodes and bipolar transistors of the electronic circuit of FIG. 6.

FIG. 6 shows an electronic circuit of the six freewheeling diodes and the six insulated gate bipolar transistors of the electronic component 100 of FIG. 3. FIG. 7 shows a three-dimensional view of the electronic component 100 of FIG. 3 illustrating the diodes and bipolar transistors of the electronic circuit of FIG. 6. Signals may be supplied at or applied to the various terminals U, V, W, EU, EV, EW, P, and gate terminals of the six transistors are numbered G1 to G6.

Figure 8:
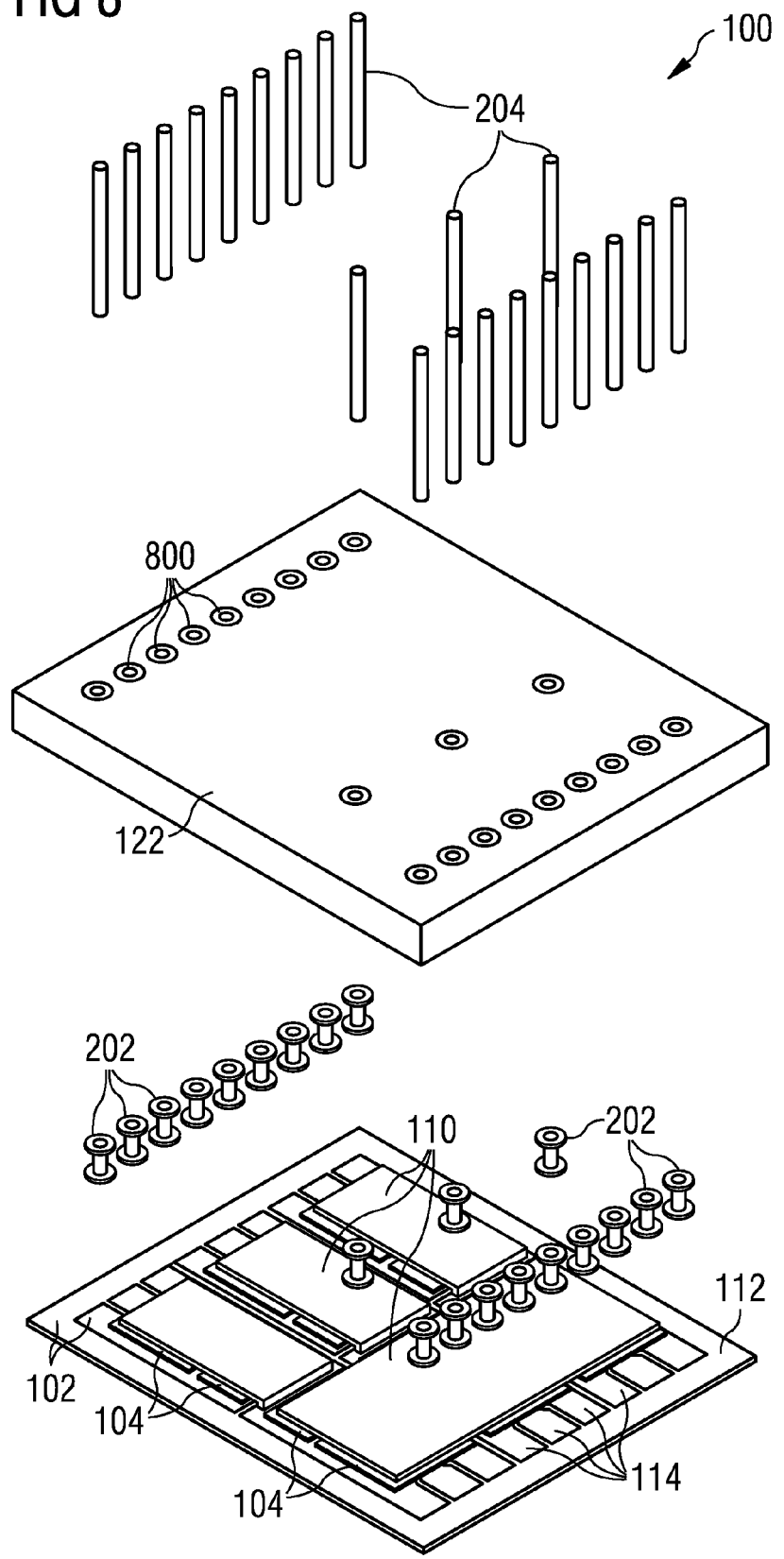
FIG. 8 shows an explosive view of the assembled electronic component of FIG. 3 together with a mold as encapsulant and contact elements for filling collets extending through the encapsulant according to an exemplary embodiment.
Figure 9:
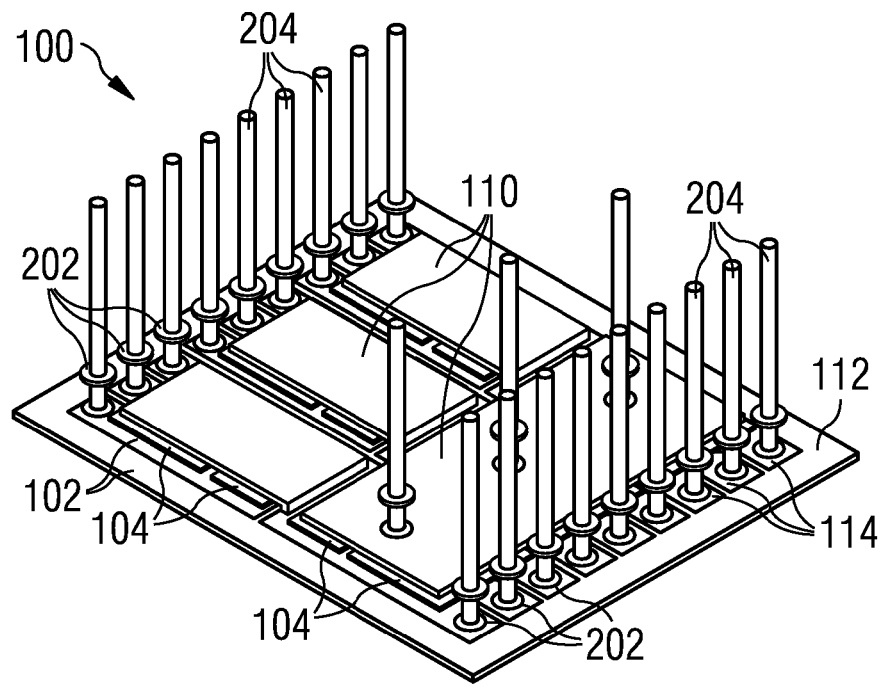
FIG. 9 shows the assembled electronic component of FIG. 3 and the contact element filled collets without encapsulant.
Figure 10:
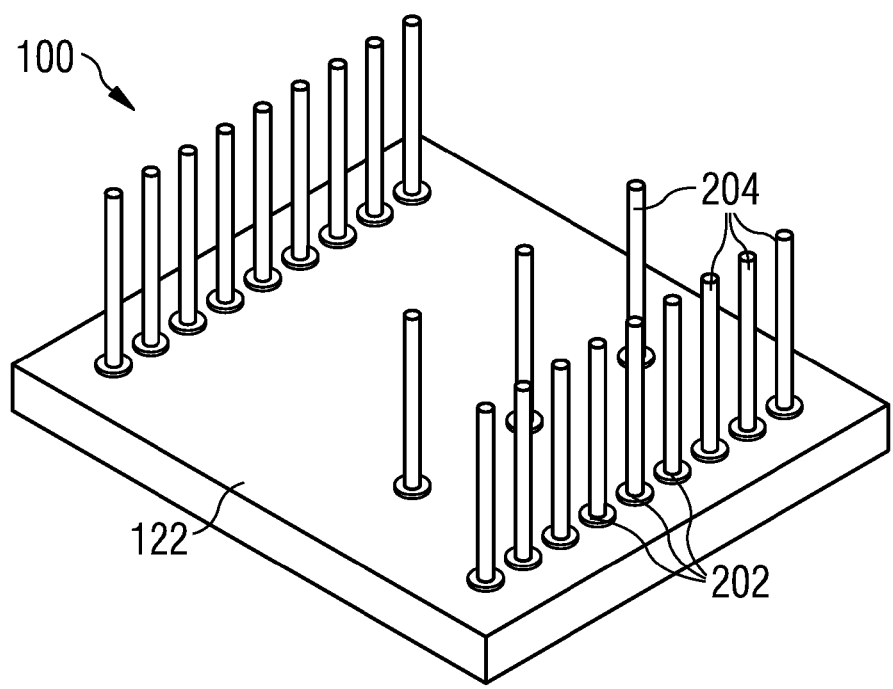
FIG. 10 shows the arrangement of FIG. 8 in an assembled view.

FIG. 8 shows an explosive view of the assembled electronic component 100 of FIG. 3 together with a mold as encapsulant 122 and contact element 204 filled collets 202 extending through the encapsulant 122 according to an exemplary embodiment. FIG. 9 shows the assembled electronic component 100 of FIG. 3 and the mounted contact element 204 filled collets 202 without encapsulant 122. FIG. 10 shows the arrangement of FIG. 8 in an assembled view.

The contact elements 204 are embodied as metallic pins. The collets 202 are embodied as plastic sleeves (i.e. hollow cylinders) reinforced at both opposing ends by collars. The collets 202 have an internal hole or through hole having a diameter matching with an external diameter of the contact elements 204. The collets 202 may be mounted by press fitting them into correspondingly shaped and dimensioned mold recesses 800.

Figure 11:
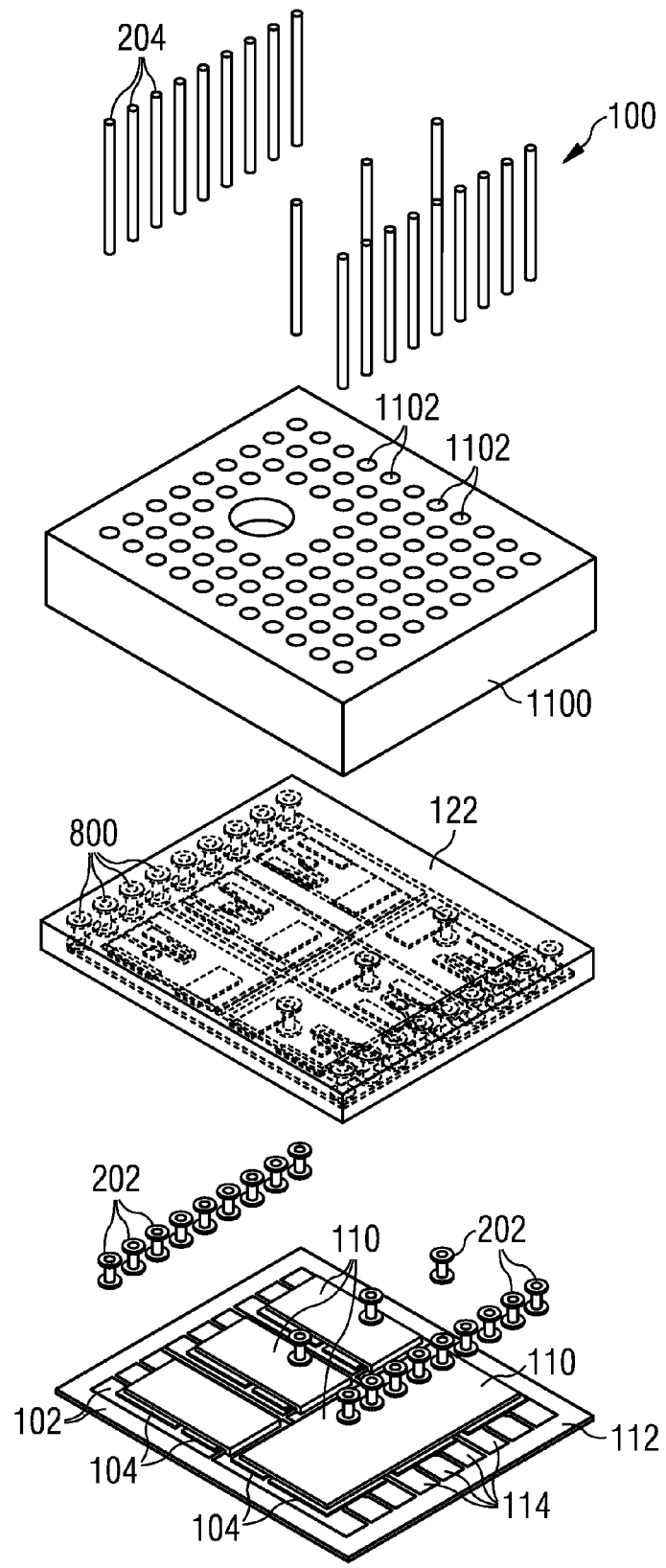
FIG. 11 shows an explosive view of the assembled electronic component of FIG. 3 together with a housing and a casting component as encapsulant and shows as well contact elements for filling collets extending through the encapsulant according to an exemplary embodiment.
Figure 12:
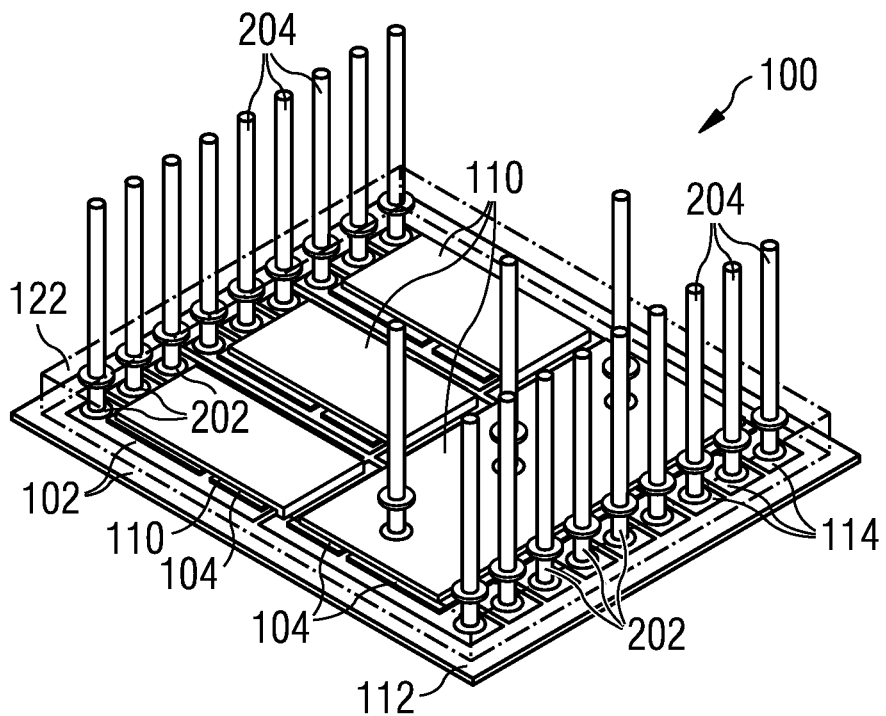
FIG. 12 shows the assembled electronic component of FIG. 3, the encapsulant and the contact element filled collets without housing.
Figure 13:
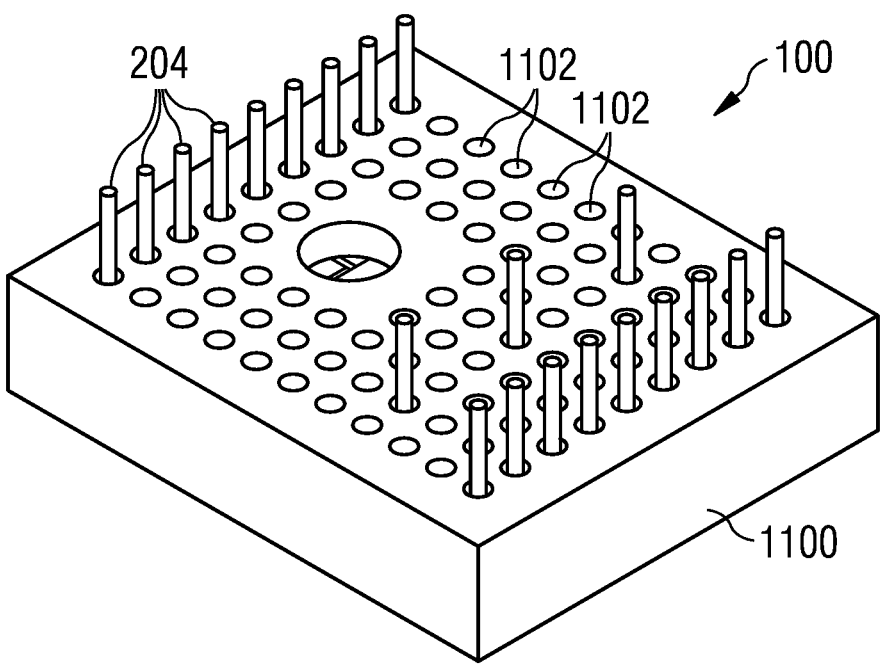
FIG. 13 shows the arrangement of FIG. 11 in an assembled view.

FIG. 11 shows an explosive view of the assembled electronic component 100 of FIG. 3 together with a hollow housing 1100, a casting component as encapsulant 122 and contact element 204 filled collets 202 extending through the encapsulant 122 according to an exemplary embodiment. FIG. 12 shows the assembled electronic component 100 of FIG. 3, the encapsulant 122 and the contact element 204 filled collets 202 without housing 1100. FIG. 13 shows the arrangement of FIG. 11 in an assembled view.

The embodiment of FIG. 11 to FIG. 13 differs from the embodiment of FIG. 8 to FIG. 10 in particular in that the mold body forming the encapsulant 122 according to FIG. 8 to FIG. 10 is substituted by a soft casting body forming the encapsulant 122 according to FIG. 11 to FIG. 13. Moreover, an external housing 1100 is provided which has contact element accommodation recesses 1102 for, together with the hole of the collets 202, accommodating contact elements 204 which are again embodied as metallic pins. The hollow housing 1100 is shaped and dimensioned to receive in its interior the arrangement shown in FIG. 12.

Figure 15:
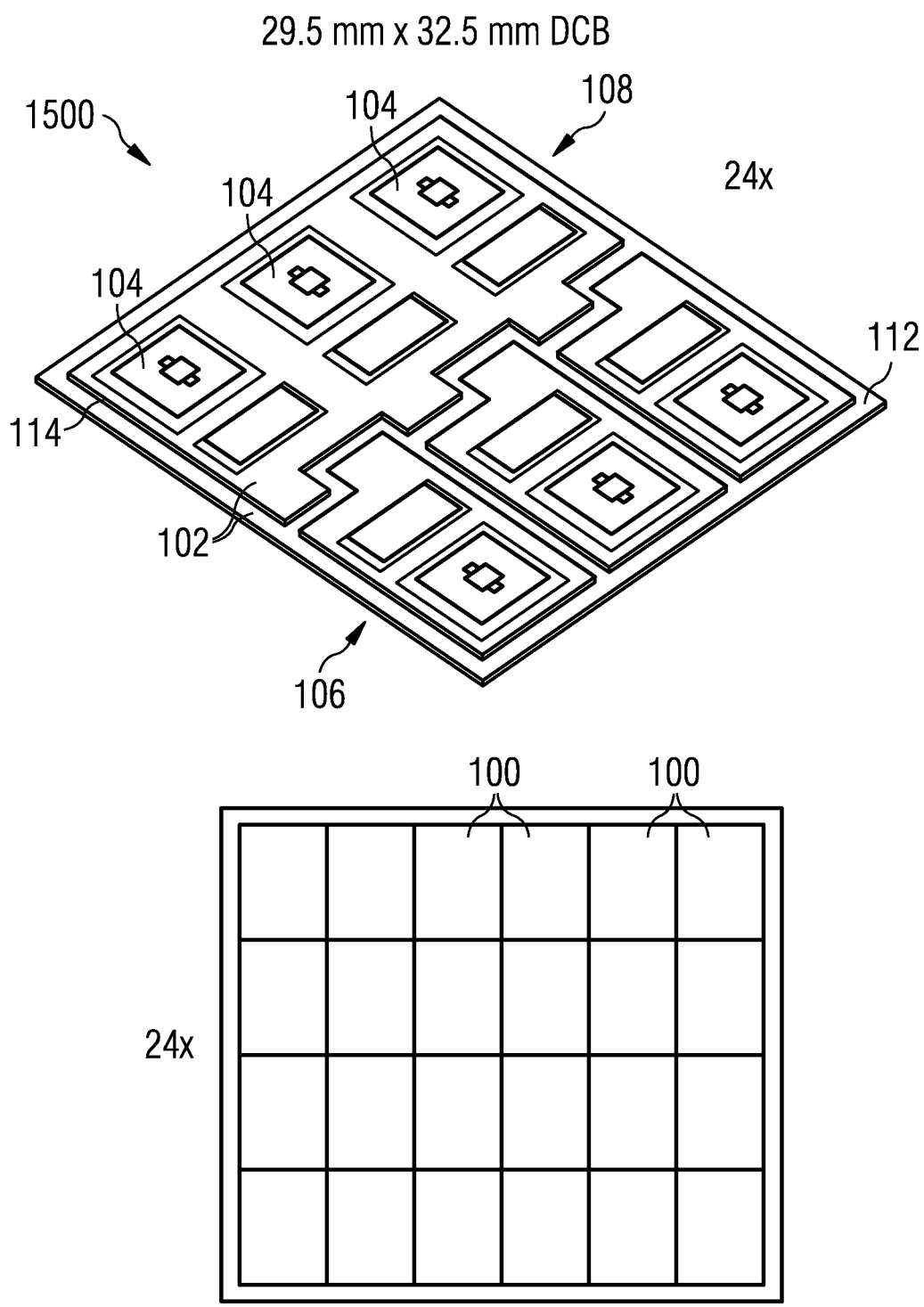

FIG. 14 shows a conventional electronic component (configured as a six pack) and FIG. 15 shows a corresponding electronic component 100 (configured as a six pack) according to an exemplary embodiment, wherein the comparison of FIG. 13 with FIG. 14 shows the improved compactness obtainable with the exemplary embodiment.

FIG. 14 shows a conventional arrangement 1400 in which the wiring between electronic chips and chip carrier is accomplished by bond wires 1402. As can be taken from the right hand side of FIG. 14, nine electronic components 1404 can be singularized from one standard-sized chip carrier.

This can be compared with an arrangement 1500 according to an exemplary embodiment shown in FIG. 15. With this architecture, 24 electronic components 100 according to an exemplary embodiment can be obtained from the standard-sized chip carrier by singularizing. By omitting bond wires 1402 and by shifting contacting elements to the third dimension, a much more compact architecture is obtained.

Figure 16:
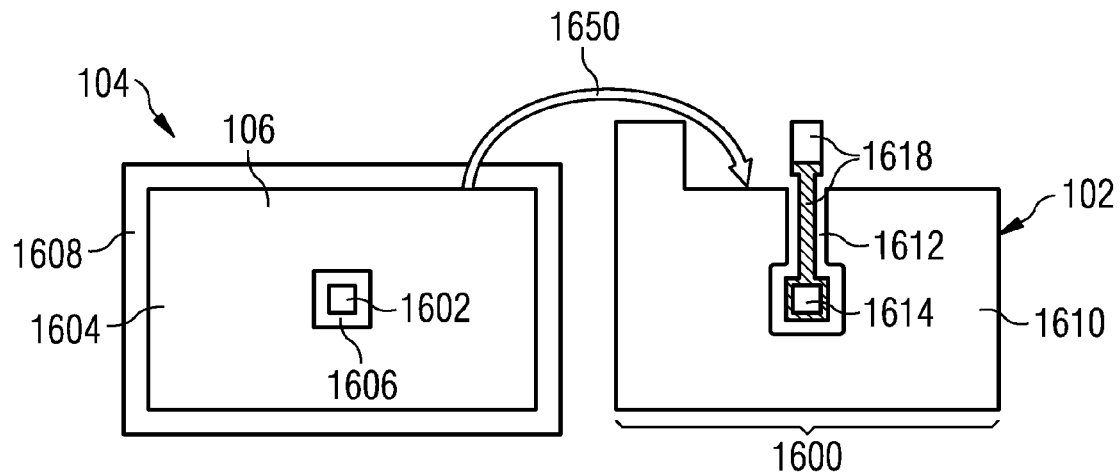
FIG. 16 shows, on the left-hand side, a plan view of a first main surface of an electronic chip and, on the right-hand side, a correspondingly configured chip contact surface of a chip carrier with a locally reduced thickness of an electronic component according to an exemplary embodiment.

FIG. 16 shows, on the left-hand side, a plan view of a first main surface 106 of an electronic chip 104 and, on the right-hand side, a correspondingly configured chip contact surface 1600 of a chip carrier 102 with a locally reduced thickness of an electronic component 100 according to an exemplary embodiment.

The first main surface 106 comprises a central electrically conductive contact zone 1602 forming a gate zone. Moreover, the first main surface 106 comprises a surrounding electrically conductive zone 1604 which annularly surrounds the central electrically conductive contact zone 1602, forms a source zone and is electrically decoupled from the latter by an intermediate annular electrically insulating zone 1606 (which may be formed of polyimide or another dielectric material). An outer electrically insulating annulus 1608 (which may be formed of polyimide, silicon oxide or another dielectric material as well) surrounds the surrounding electrically conductive zone 1604. Structures 1602, 1604, 1606, 1608 may be at the same height level, i.e. may share a common substantially planar surface plane. However, it is possible that structures 1608 and 1604 overlap so as to form steps in the order of magnitude of micrometers (for instance 10 μm).

The chip contact surface 1600 of the chip carrier 102 comprises a narrow strip like electrically conductive contact zone 1618 and a planar or two-dimensional strip surrounding electrically conductive contact zone 1610. An intermediate electrically insulating zone 1612 (which may be formed of polyimide or another dielectric material, or which may be simply an air-filled gap) electrically decouples the strip like electrically conductive contact zone 1618 with regard to the strip surrounding electrically conductive contact zone 1610. Structures 1618, 1610, and optionally 1612 may be at the same height level (for instance indicated schematically by the paper plane of FIG. 16) with the exception of a (here dashed) central subsection of the electrically conductive contact zone 1618 which may be locally lowered (for instance by forming it with a reduced thickness), for instance having a surface within or below the paper plane of FIG. 16).

In view of the height profile of the chip contact surface 1600 shown on the right-hand side of FIG. 16, attaching the chip contact surface 1600 onto the first main surface 106 of the electronic chip 104 (as indicated schematically by an arrow 1650) has the effect that a locally elevated central pad 1614 of the electrically conductive contact zone 1618 directly contacts the central electrically conductive contact zone 1602 and that the surrounding electrically conductive zone 1604 contacts the strip surrounding electrically conductive contact zone 1610, while the locally thinned intermediate electrically insulating zone 1612 remains spaced with regard to the surrounding electrically conductive zone 1604 to prevent an undesired short-circuiting.

Consequently, the gate line (dashed region in FIG. 16) on the DCB is locally thinner (in a direction perpendicular to the paper plane of FIG. 16) so as to be spaced with regard to the source area, but contacts the gate position. The described height profile can be accomplished by a partially etched DCB. This concept works even with an advanced diffusion soldering, wherein an appropriate solder stop should be defined.

Figure 17:
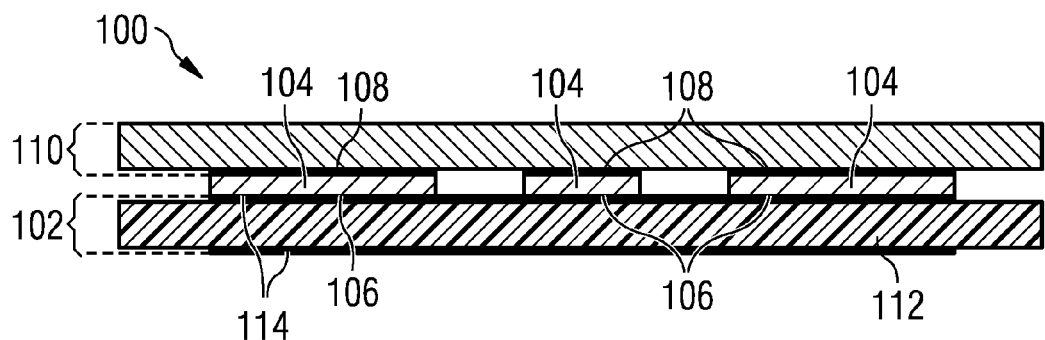
FIG. 17 shows a cross-sectional view of an electronic component according to the architecture of FIG. 16 with a DCB as chip carrier and a PCB as redistribution structure.

FIG. 17 shows a cross-sectional view of an electronic component 100 (or a pre-form thereof) according to the architecture of FIG. 16 with a DCB as chip carrier 102 and a PCB as redistribution structure 110.

Figure 18:
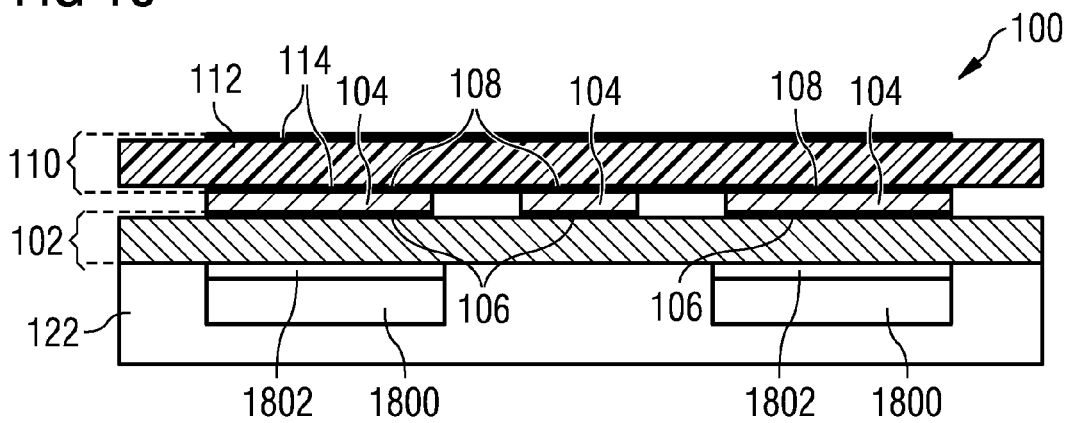
FIG. 18 shows a cross-sectional view of an electronic component according to the architecture of FIG. 16 with a PCB as chip carrier and a DCB as redistribution structure.

FIG. 18 shows a cross-sectional view of an electronic component 100 (or a pre-form thereof) according to the architecture of FIG. 16 with a PCB as chip carrier 102 and a DCB as redistribution structure 110.

As can furthermore be taken from FIG. 18, the electronic component 100 may optionally comprise one or more further electronic chips 1800 such as control chips and/or logic chips, which are mounted on an electrically conductive structure 1802 at the lower surface of the chip carrier 102 (here embodied as PCB). They can also be optionally encapsulated by an encapsulant 122 (it is however also possible that no molding is performed, and standard components are implemented). Using both main surfaces of the chip carrier 102 for mounting electronic chips 104, 1800 additionally increases the compactness and also shows the potential of the disclosed wiring architecture to produce modules fulfilling complex electronic tasks.

FIG. 19 shows, on the left-hand side, a plan view of a first main surface 106 of an electronic chip 104 with a locally reduced thickness and, on the right-hand side, a correspondingly configured contact portion of a chip carrier 102 of an electronic component 100 according to an exemplary embodiment.

The embodiment of FIG. 19 differs from the embodiment of FIG. 16 particularly in that the height profile of the electrically conductive elements is now not formed on the chip contact surface 1600 of the chip carrier 102, but in contrast to this on the first main surface 106 of the electronic chip 104. In other words, all portions of the strip like electrically conductive contact zone 1618 are now formed on the same height level and are also formed on the same height level as the strip surrounding electrically conductive contact zone 1610. In contrast to this, as indicated by reference numeral 1900, a dashed portion of the surrounding electrically conductive zone 1604 which corresponds to the laterally narrow central section of the strip like electrically conductive contact zone 1618 is locally thinner (for instance by carrying out a thinning procedure or by simply locally omitting material) so that section 1900 does not contact the electrically conductive contact zone 1618 when the chip contact surface 1600 of the chip carrier 102 is attached to the first main surface 106 of the electronic chip 104.

Thus, according to FIG. 19, the gate path may be left out when attaching contact medium to the IGBT source. Such a design is also compatible with the formation of a solder stop layer for PCB (for example it is possible to not print solder or sinter material there). The thickness of the solder stop layer should be lower than the contacting element.

FIG. 20 shows, on the left-hand side, a plan view of a first main surface 106 of an electronic chip 102 with a local electrically insulating region 1606 and, on the right-hand side, a correspondingly configured chip contact surface 1600 of a chip carrier 102 of an electronic component 100 according to an exemplary embodiment.

According to the embodiment of FIG. 20, both the first main surface 106 of the electronic chip 104 and the chip contact surface 1600 of the chip carrier 102 may be formed without height profile of their electrically conductive elements, i.e. with a planar surface. In contrast to this, an electrically insulating bridge 2000 illustrated with dashed lines in FIG. 20 can be formed to connect (and optionally integrally formed with) the annular electrically insulating zones 1606, 1608 at a position at which the narrow section of the strip like electrically conductive contact zone 1618 is located when the two surfaces 106, 1600 are attached to one another, see reference numeral 1650.

FIG. 21 to FIG. 24 show three-dimensional views of structures obtained during carrying out a method of manufacturing a plurality of electronic components 100 in a batch process according to an exemplary embodiment. The electronic chips 104 to be mounted according to this embodiment, may be either mounted in a standard configuration or in a flip chip configuration. A detail 2050 shown in FIG. 20 (obtained after flipping) shows a portion of a layer stack corresponding to the embodiment of FIG. 35 (for detailed description, see below). For the embodiments of FIG. 18 to FIG. 20, in particular for the embodiment of FIG. 20, it is possible to implement such kind of layer stack as well. For example, the provision of an electrically insulating side edge cover 3500 covering part of the side edge and covering part of the bottom area of the electronic chip 104 can be implemented advantageously also in the embodiments of FIG. 18 to FIG. 20.

Figure 21:
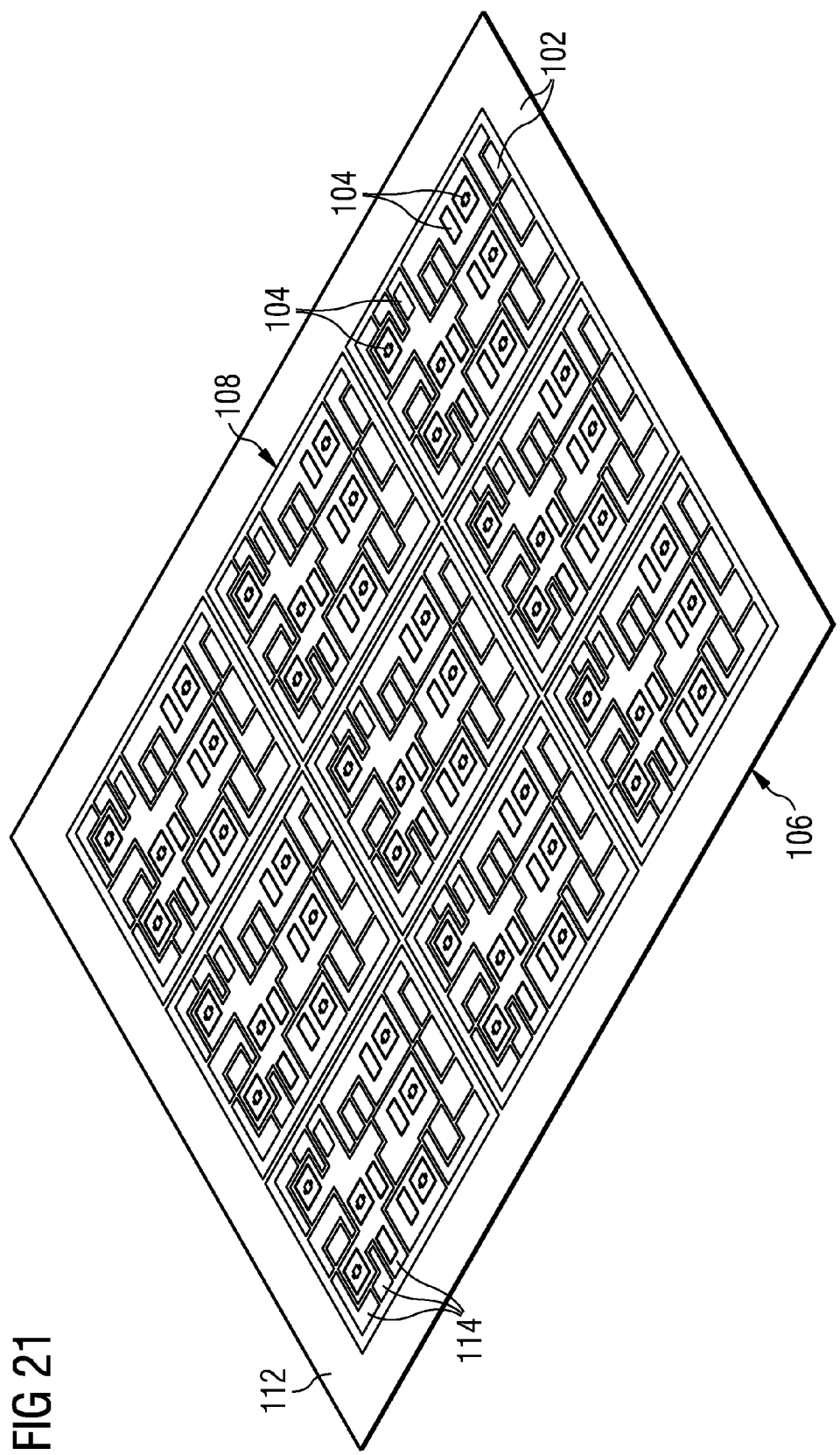
FIG. 21 to FIG. 24 show three-dimensional views of structures obtained during carrying out a method of manufacturing a plurality of electronic components in a batch process according to an exemplary embodiment.

As can be taken from FIG. 21, one possible procedure starts with a large DCB as chip carrier 102 for multiple electronic components 100 to be formed in a batch process. The electrically conductive structure 114 on one main surface of electrically insulating and thermally conductive substrate 112 is patterned so as to form nine matrix like sections (i.e. arranged in rows and columns) as a basis for the formation of nine electronic components 100. Each of the sections is further patterned for separately mounting multiple electronic chips 104 thereon. Then, the various electronic chips 104 are placed on the patterned electrically conductive structure 114 and connected therewith, for instance by soldering.

Figure 22:
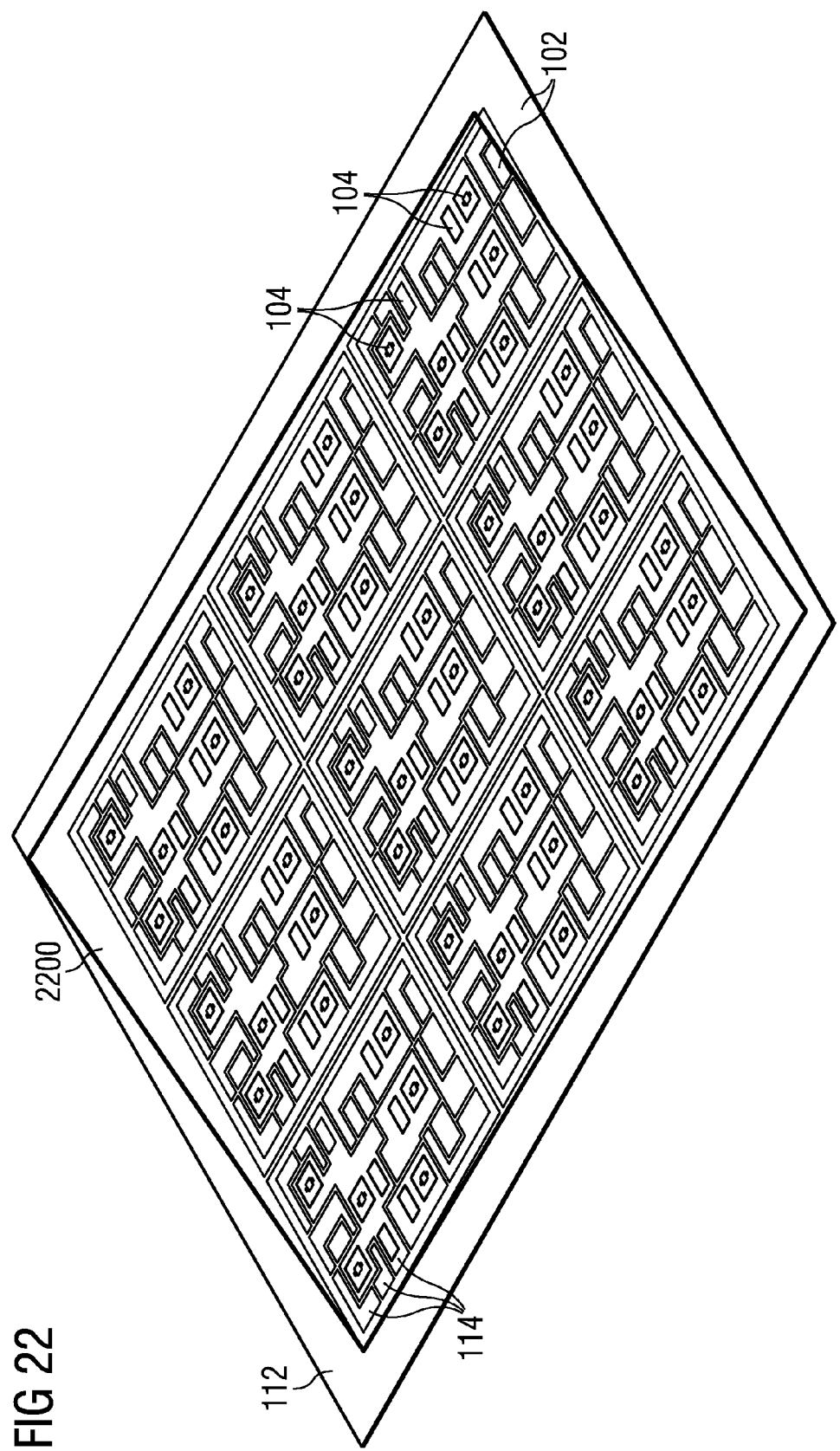

Now referring to FIG. 22, a solder (for example a soft solder, a hard solder, or a particle solder) or sinter structure 2200 may then be applied to the surface of the arrangement shown in FIG. 21. This may prepare the arrangement for the subsequent formation of height distance compensation structures 2300 mechanically and electrically connecting the redistribution structure 110 (for instance when embodied as PCB) to the chip carrier 102 (here embodied as DCB) by bridging a gap between the redistribution structure 110 in the chip carrier 102, compare FIG. 23.

That are various possibilities for height difference compensation for providing a direct contact between the chip carrier 102 (in the shown embodiment a DCB) and redistribution structure 110 (in an embodiment a PCB). One possibility is, when sintering the electronic chips 104 onto the chip carrier 102, it is possible to also sinter small (for example copper) posts for later providing electric contact with the PCB. Another possibility is to form (for instance 150 μm dimensioned) stud bumps (for example of copper) on the DCB to allow leveling (the electronic chips 104 may have a height of 120 μm for a 1200 V isolation). It is also possible to form a (for instance 150 μm high) ribbon bond on the DCB for forming a contact with the PCB. FIG. 38 to FIG. 41, which will be described below in more detail, show four alternatives for forming height difference compensation structures 2300.

Figure 23:
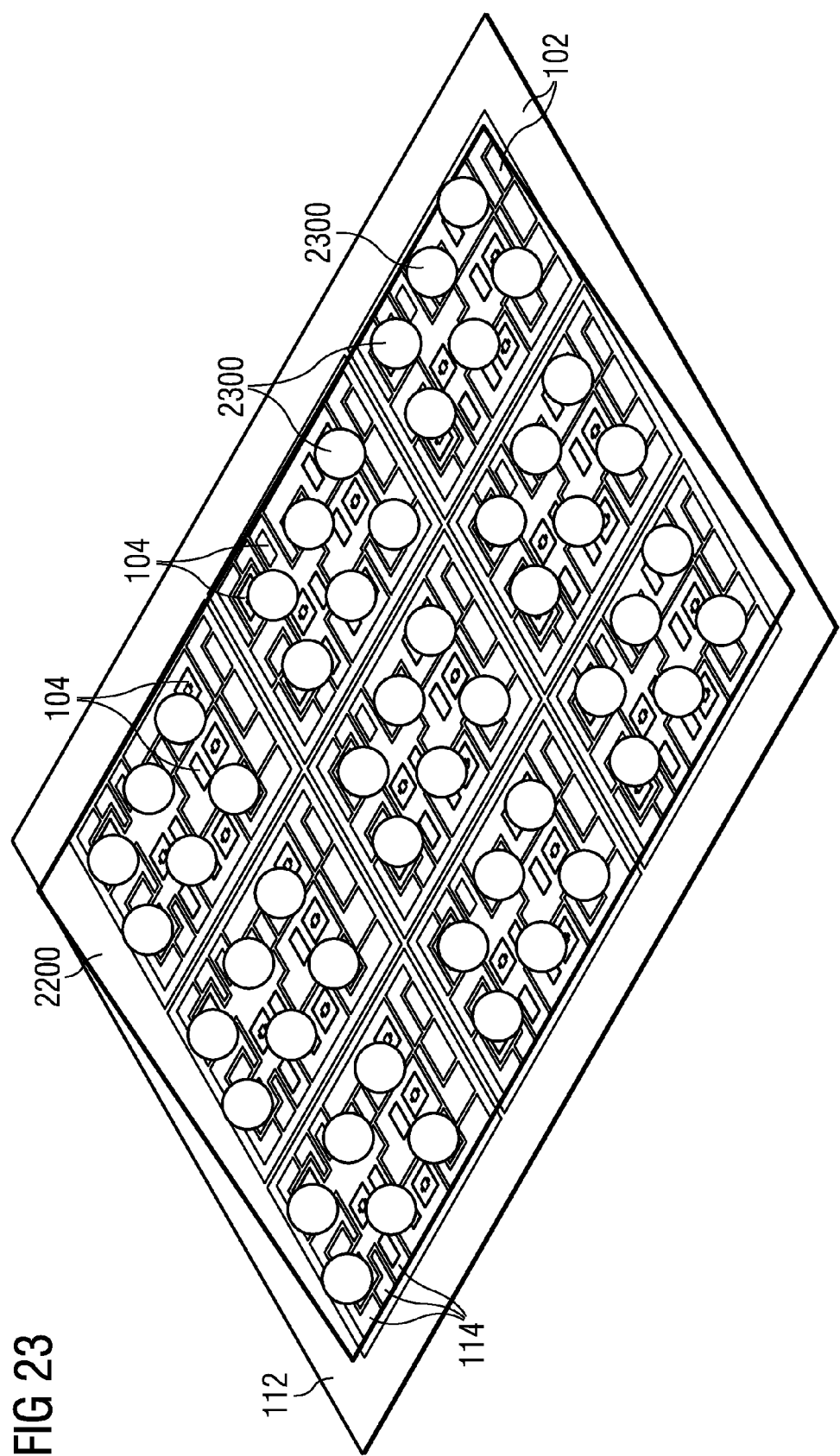

In the embodiment shown in FIG. 23, however, solder structures (such as solder balls) are formed (for instance applied or printed) as height distance compensation structures 2300 for connecting the redistribution structure 110 with the chip carrier 102.

The PCB may be formed with holes for casting or molding. Furthermore, it is possible to apply a cast with silicone and to singularize the arrangement into sections. Alternatively, an underfill may be used.

Figure 24:
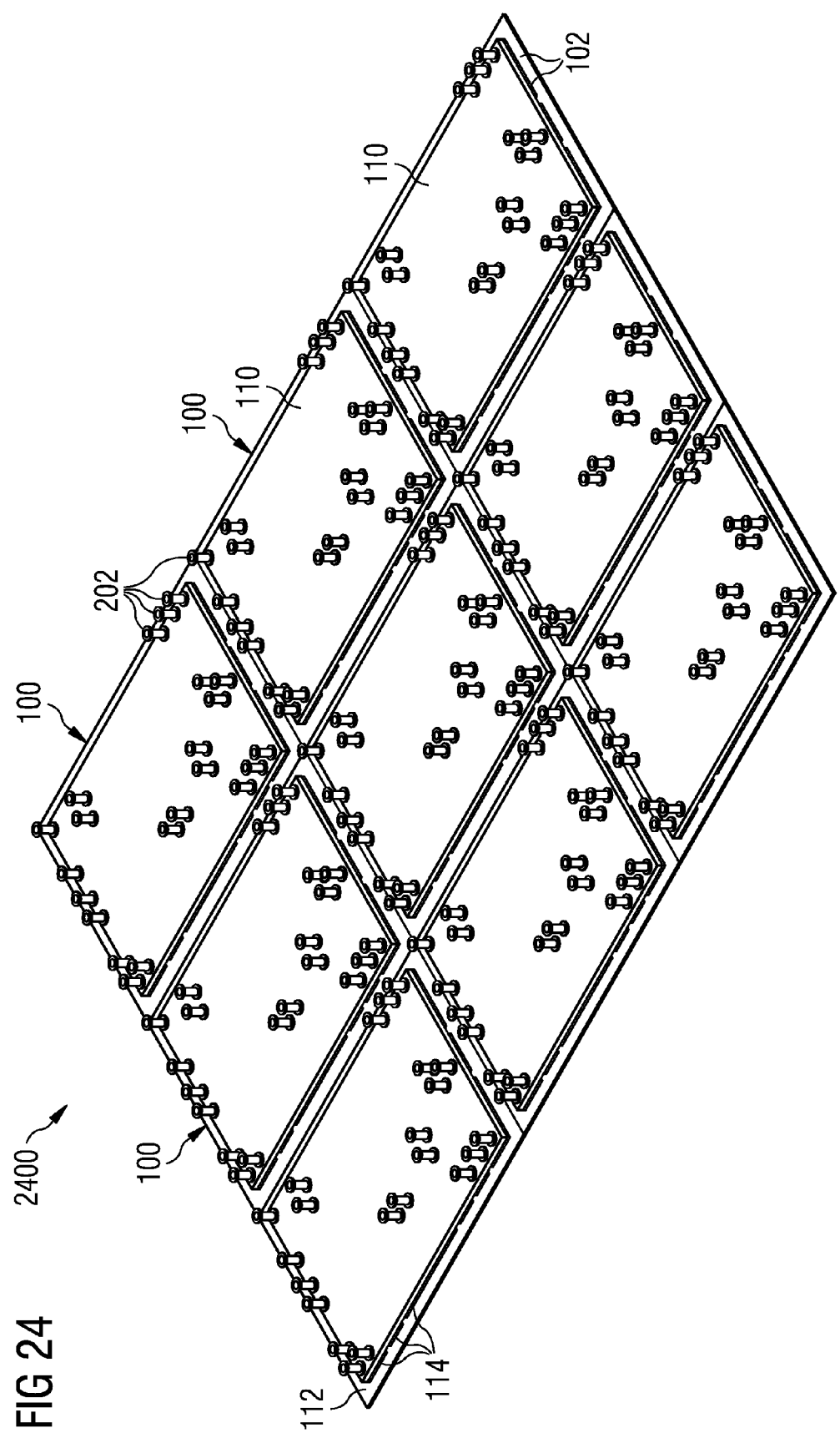

By attaching the redistribution structure 110 to the arrangement of FIG. 23, an arrangement 2400 is obtained, as can be taken from FIG. 24. The arrangement 2400 may also comprise an encapsulant (not shown, for instance a cast with silicone, a molding, etc.). It is also possible to form collets 202 (which may be filled with electric contact elements) protruding into an interior of the electronic components 100 (in the shown embodiment protruding through the redistribution structure 110, the optional encapsulant, up to the chip carrier 102), which may be obtained after singularising the arrangement 2400. The collets 202 (which may be free of a ring or collar on top) may be assembled by press fitting and may be fed through holes in the PCB.

Figure 25:
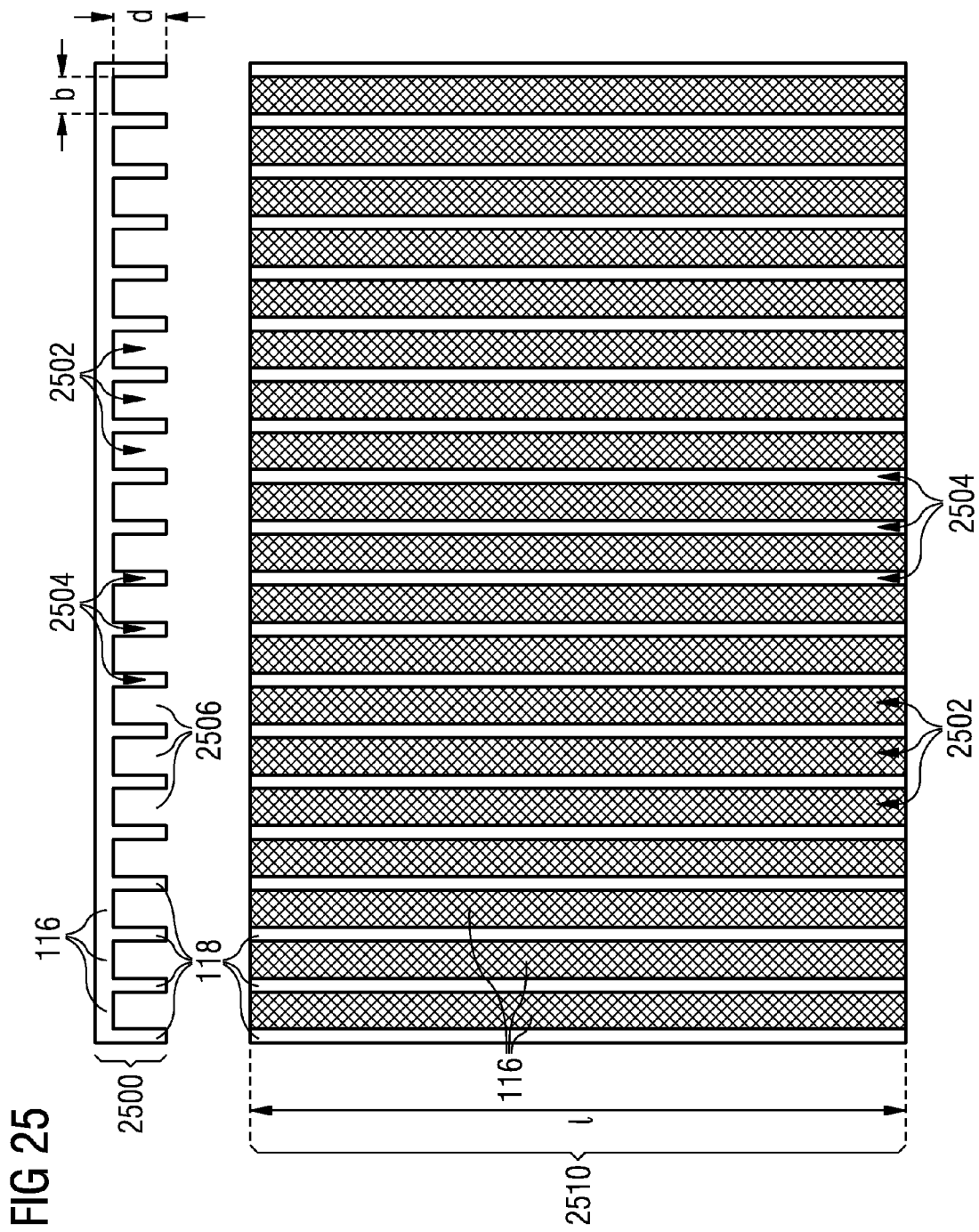
FIG. 25 to FIG. 27 show plan views (and FIG. 25 shows also a side view) of structures obtained during carrying out a method of manufacturing a plurality of electronic components in a batch process according to an exemplary embodiment.
Figure 26:
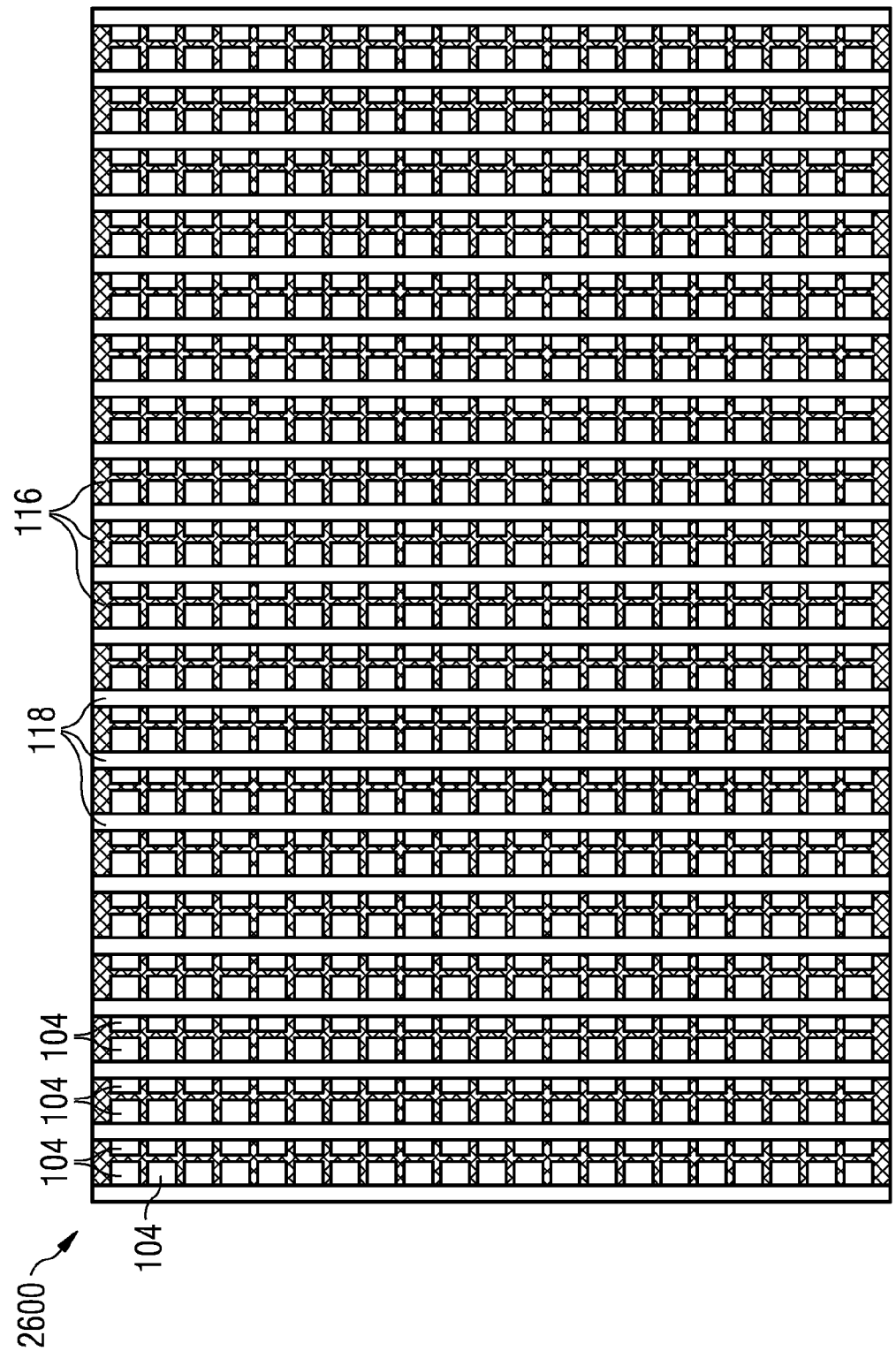
Figure 27:
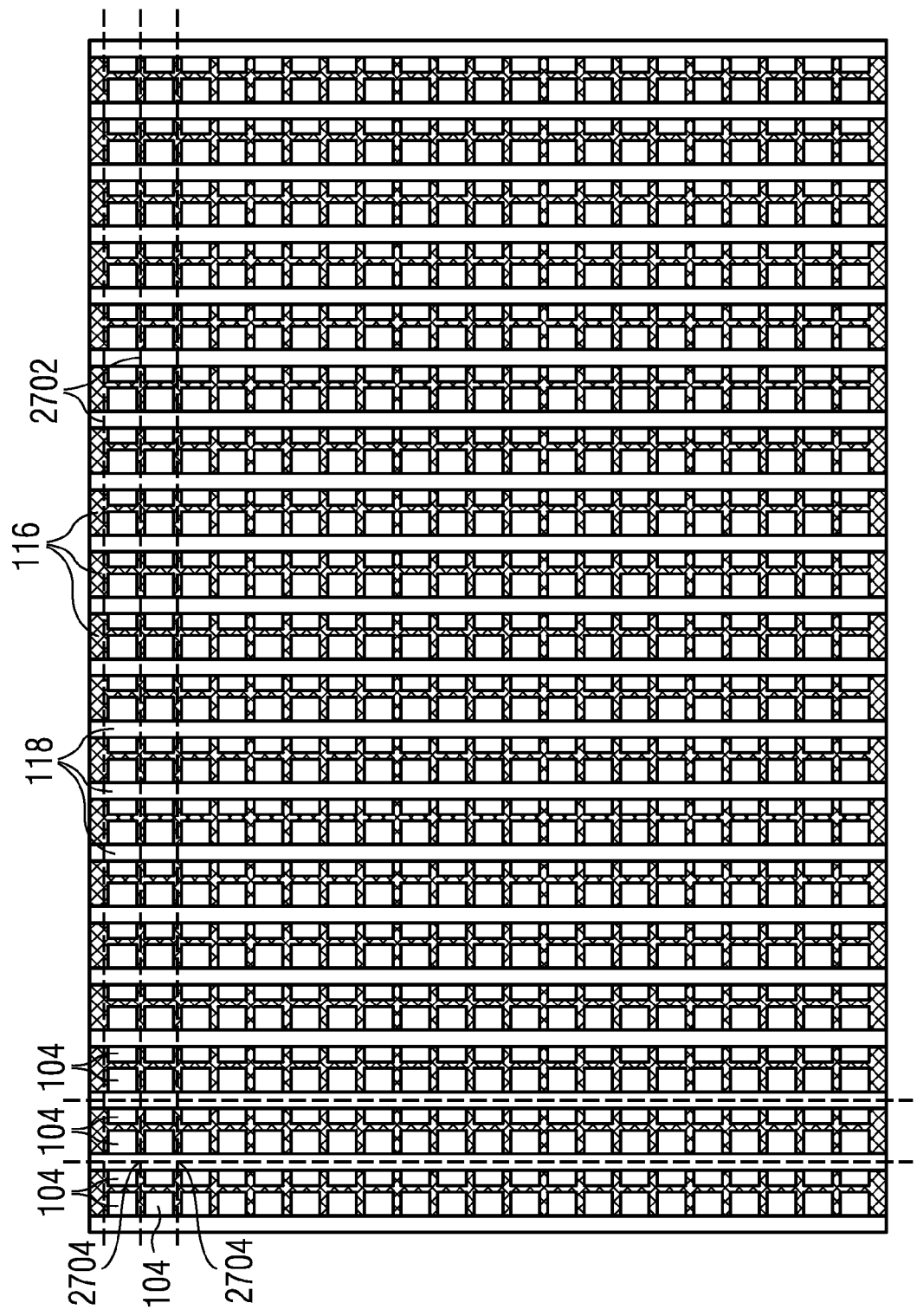

FIG. 25 to FIG. 27 show plan views of structures obtained during carrying out a method of manufacturing a plurality of electronic components 100 in a batchwise process according to an exemplary embodiment.

FIG. 25 shows a side view 2500 and shows a plan view 2510 of an electrically conductive sheet (not drawn to scale), such as a metal foil, which has been made subject to an etching or milling procedure so that a plurality of oblong trenches 2502 are formed which are aligned parallel to one another and are separated from one another by oblong walls 2504. The electrically conductive sheet may have a dimension of for instance 1 m×2 m (an upper limit is defined by the dimensions which can be served by a milling machine). The electrically conductive sheet later forms the basis for multiple redistribution structures 110 (see FIG. 28) obtained after singularisation. A plurality of chip accommodation cavities 2506 are delimited by respective sections of the oblong trenches 2502 and the oblong walls 2504. In other words, respective sheet portions 116 and corresponding wall portions 118 delimit such chip accommodation cavities 2506. After singularization, a sheet portion 116 and an assigned wall portion 118 may form a clip. Thus, the electrically conductive sheet shown in FIG. 25 may be considered as a batch structure which can be singularized so as to form individual clips as redistribution structures 110 of the electronic components 100 to be formed.

For instance, the oblong trenches 2502 may have a depth, d, corresponding to the thickness of the electronic chips 104 (plus die attach material), for instance 150 μm. The length, l, of the oblong trenches 2502 is defined by the number and dimension of electronic chips 104 to be accommodated therein, and can for instance be 1000 mm. The width, b, of the trenches 2502 is also defined by the dimension of the electronic chips 104 to be accommodated therein and by a gap in between, and may for instance be 10 mm. The material of the electrically conductive sheet (for instance MoCu or WCu, or softened copper, for instance obtained as a consequence of a chlorine contribution) shown in FIG. 25 may be selected or adjusted so as to match with the thermal expansion coefficients of the other constituents involved in the manufacture of the electronic components 100.

In order to obtain a semifinished product 2600 shown in FIG. 26, a plurality of electronic chips 104 are accommodated and immobilized in the above-described chip accommodation cavities 2506. In the shown embodiment, a pair of an IGBT chip and a diode chip are placed on a sheet portion 116 between two juxtaposed walls 118. In the shown embodiment, 19×21 pairs of an IGBT chip and a diode chip are placed in the various oblong trenches 2502. The attachment of the dies or electronic chips 104 to the electrically conductive sheet may be performed by metal sintering and in a batch procedure.

The described procedure may be followed by an optional polyimide spray coating, drying, imaging, developing, curing, and solder/silver sinter/printing procedure.

As can be taken from FIG. 27, a singularization of the semifinished product 2600 or batch arrangement of FIG. 26 may then be performed to thereby form a plurality of preforms for electronic chips 100. This is indicated schematically in FIG. 27 by horizontal singularization lines 2702 and by vertical singularization lines 2704. For example, the singularization may be performed by sawing or milling. The separation by sawing or milling may be performed perpendicular to the traces and parallel on the left edge along and partly in the drain contacts.

FIG. 28 to FIG. 34 show cross-sectional views of structures obtained during carrying out a method of manufacturing electronic components 100 after the batch process described referring to FIG. 25 to FIG. 27 according to an exemplary embodiment.

Figure 28:
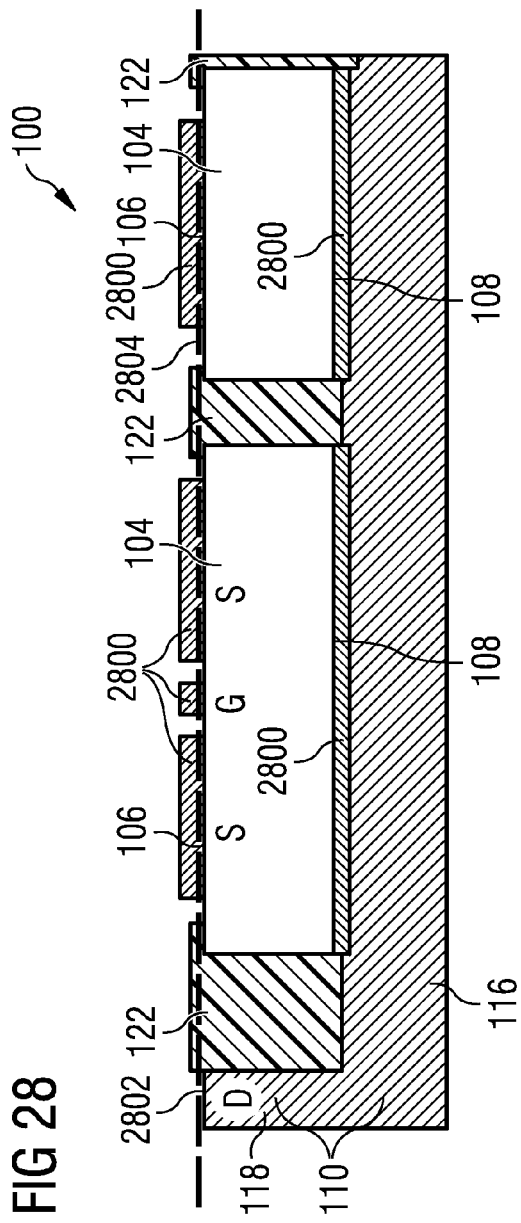
FIG. 28 to FIG. 34 show cross-sectional views of structures obtained during completing a method of manufacturing an electronic component after the batch process described referring to FIG. 25 to FIG. 27 according to an exemplary embodiment.

FIG. 28 shows an electronic component 100 (which may be denoted as clip module or chip in clip module) obtained by singularising the arrangement of FIG. 27.

Figure 30:
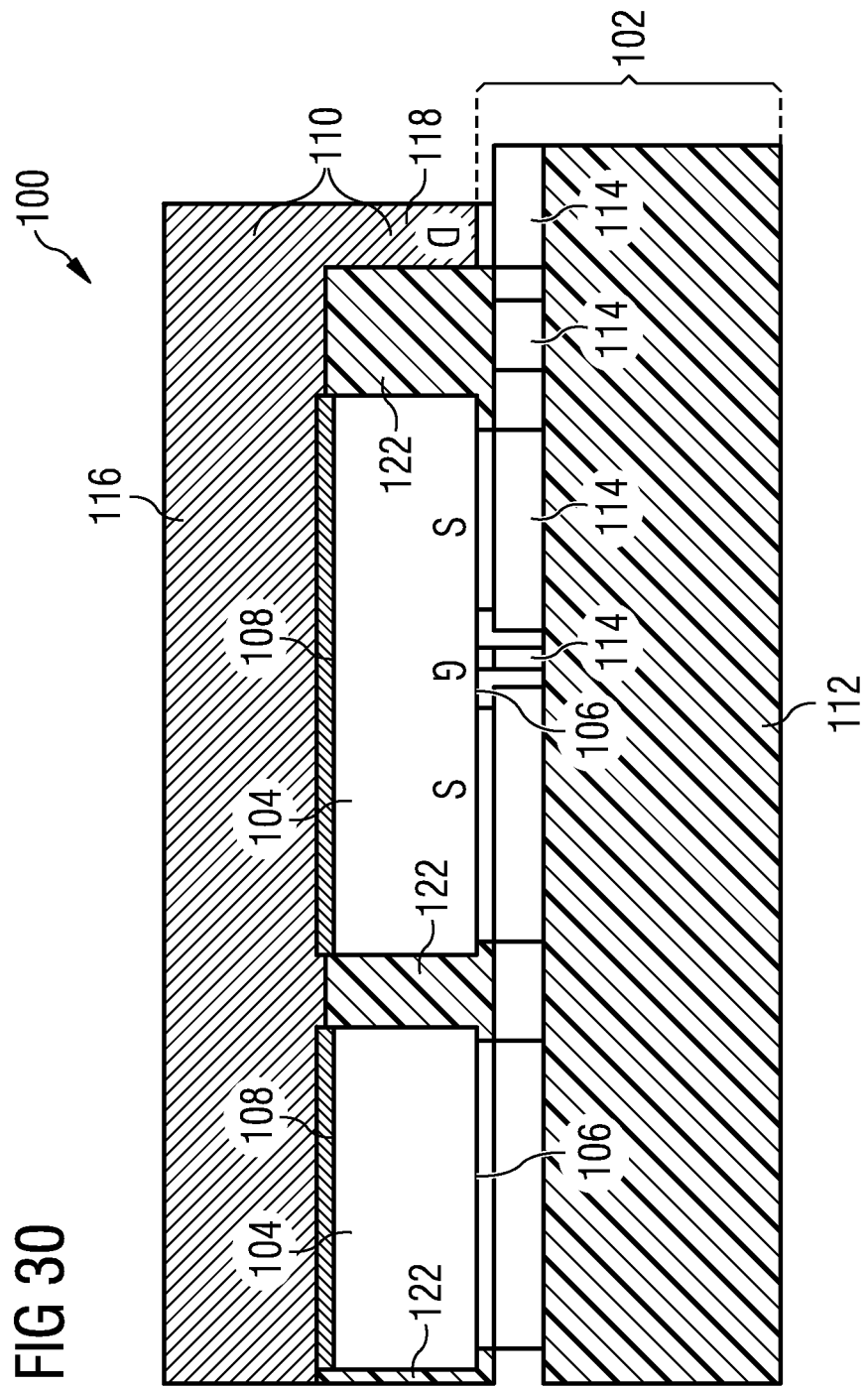

FIG. 28 shows the electronic component 100 with two electronic chips 104 each having a first main surface 106 to be attached to an electrically conductive chip carrier 102 (see FIG. 30 showing the electronic component 100 with attached planar chip carrier 102). Furthermore, the electronic component 100 of FIG. 28 comprises a sheet-like redistribution structure 110 comprising a planar electrically conductive sheet portion 116 accommodating the electronic chips 104 at a respective second main surface 108 thereof. The redistribution structure 110 additionally comprises a vertically extending wall portion 118 integrally formed with and extending from the sheet portion 116 up to a height level 2804 substantially corresponding to the first main surface 106 of both electronic chips 104 so that chip contacts (see also reference numeral 2800) on both main surfaces 106, 108 are electrically connectable to the chip carrier 102 in a common connection plane defined by the first main surface 106 and a free upper end 2802 of the wall portion 118, i.e. corresponding to height level 2804.

The electronic component 100 shown comprises the redistribution structure 110 forming part of the processed metal foil (for instance copper foil) of FIG. 25 and comprises the two electronic chips 104 mounted thereon (wherein the large electronic chip 104 on the left-hand side of FIG. 28 is an IGBT, and the smaller electronic chip 104 on the right hand side is a diode). The electronic chips 104 are provided with sinter paste 2800 on a top and on a bottom surface thereof. Moreover, an encapsulant 122 has been formed which encapsulates the electronic chips 104 and part of the redistribution structure 110 so as to fill gaps in between, provide for a mechanical stabilization and contribute to a proper electric isolation. In an embodiment, the encapsulant 122 may be formed of polyimide. An overlap of encapsulant 122 over a chip edge in terms of length and thickness should be selected so that it suffices for a proper electric isolation.

Figure 29:
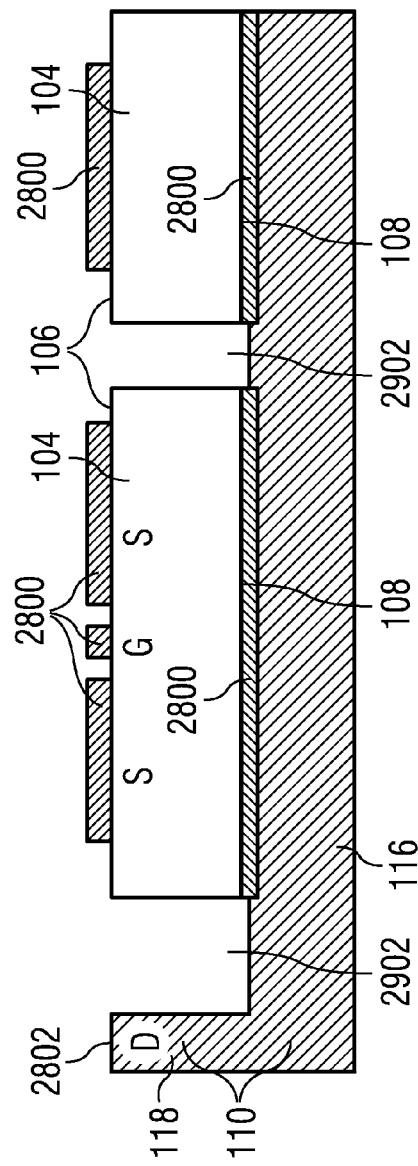

However, formation of the encapsulant 122 at the present stage of the manufacturing procedure is optional and can be omitted in case of an electronic component 100 shown in FIG. 29. In this embodiment, gaps 2902 remain unfilled for the moment.

In order to obtain the electronic component 100 shown in FIG. 30, the electronic component 100 of FIG. 28 is turned upside down so as to bring the electronic chips 104 into a flip chip position. For the IGBT chip, this means that the gate pad and the source pad are now located on a bottom position. In this turned around position, the electronic component 100 of FIG. 28 is attached to a patterned electrically conductive structure 114 of chip carrier 102 embodied as DCB. By this procedure, not only a source pad and a gate pad of the electronic chip 104 embodied as IGBT chip is connected to the patterned electrically conductive structure 114 of the DCB, but simultaneously the drain contact provided by the redistribution structure 110 is connected to the electrically conductive structure 114 as well. The source-drain distance is adjustable to allow routing and to obtain an appropriate creeping distance. The procedure according to FIG. 30 may also be performed on a customer side.

Figure 31:
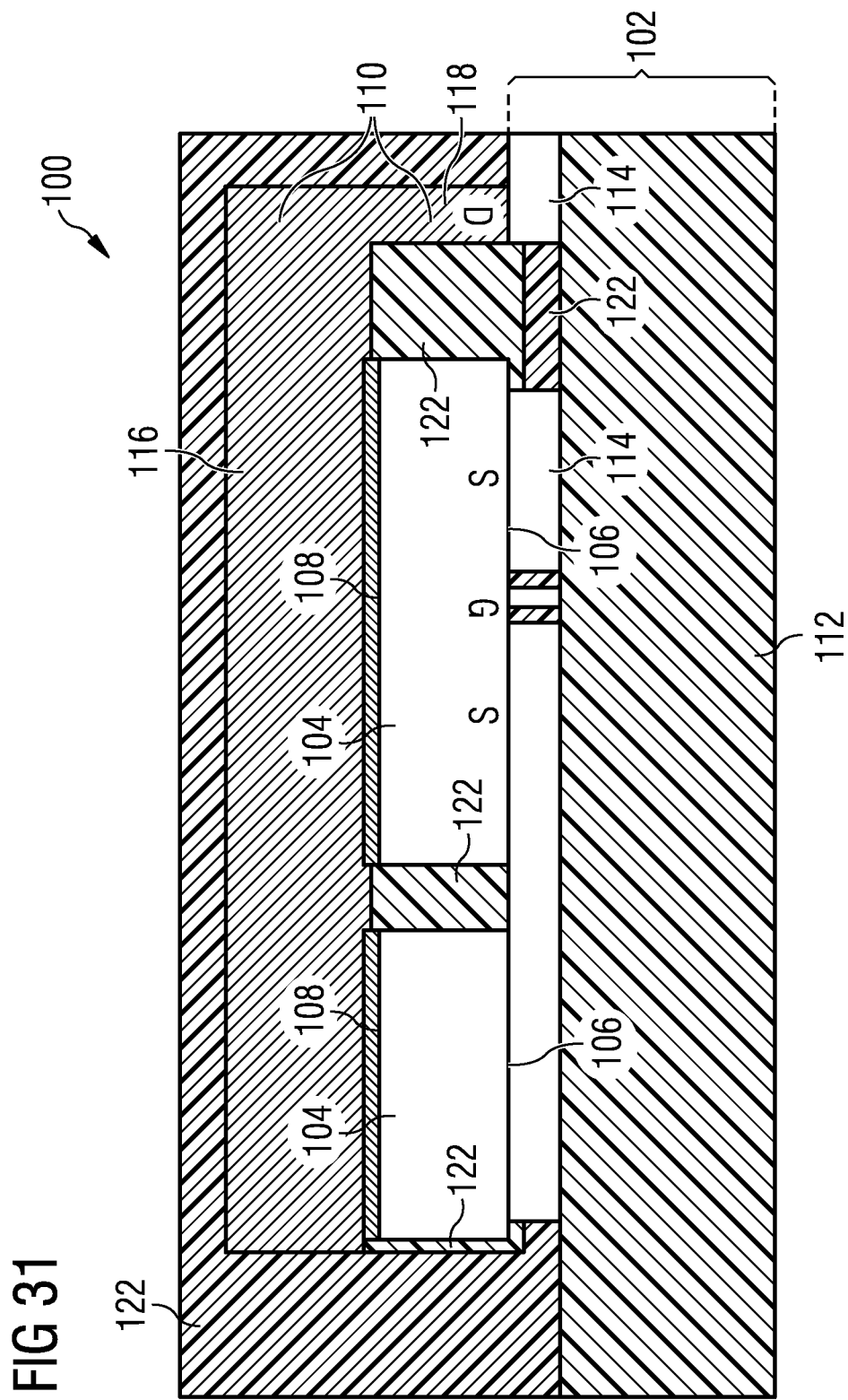

In order to obtain the electronic chip 100 shown in FIG. 31, a second encapsulating procedure may be carried out so as to externally encapsulate exposed electrically conductive surfaces of the chip carrier 102 and the redistribution structure 110. This second encapsulating procedure may be embodied as molding.

Figure 32:
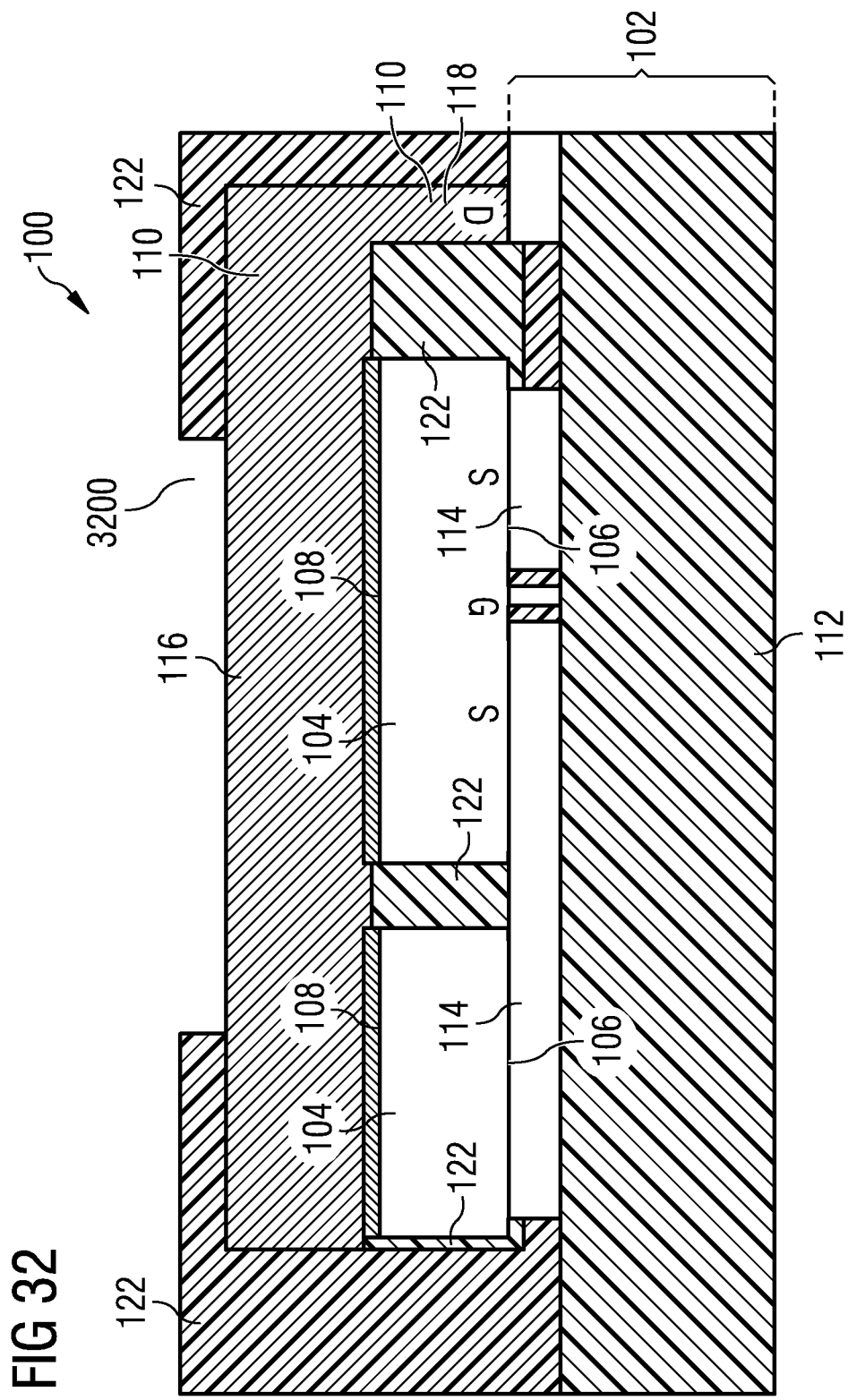

An alternative to the embodiment of FIG. 31 is shown in FIG. 32. According to FIG. 32, the second encapsulating procedure is carried out by a spray coating or casting procedure (see dashed areas in FIG. 32) rather than by molding. An access hole 3200 is formed in the upper portion of the encapsulant 122 so as to externally expose a surface portion of the redistribution structure 110.

Figure 33:
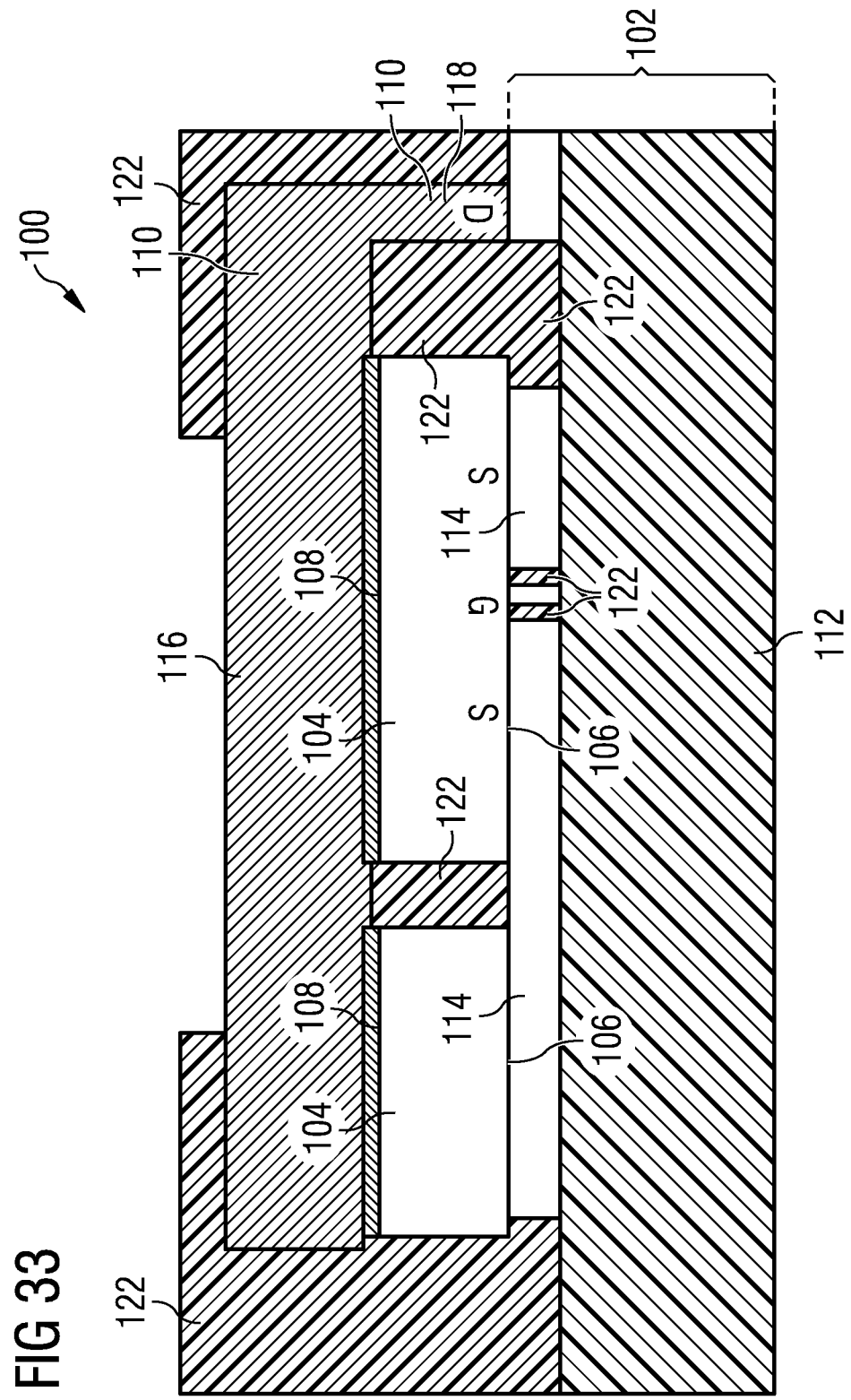

FIG. 33 shows that, if no encapsulating procedure has been carried out at the stage of FIG. 29, the empty gaps 2902 may also be filled out during the spray coating or casting procedure referred to in the description of FIG. 32 (see dashed areas in FIG. 33).

Figure 34:
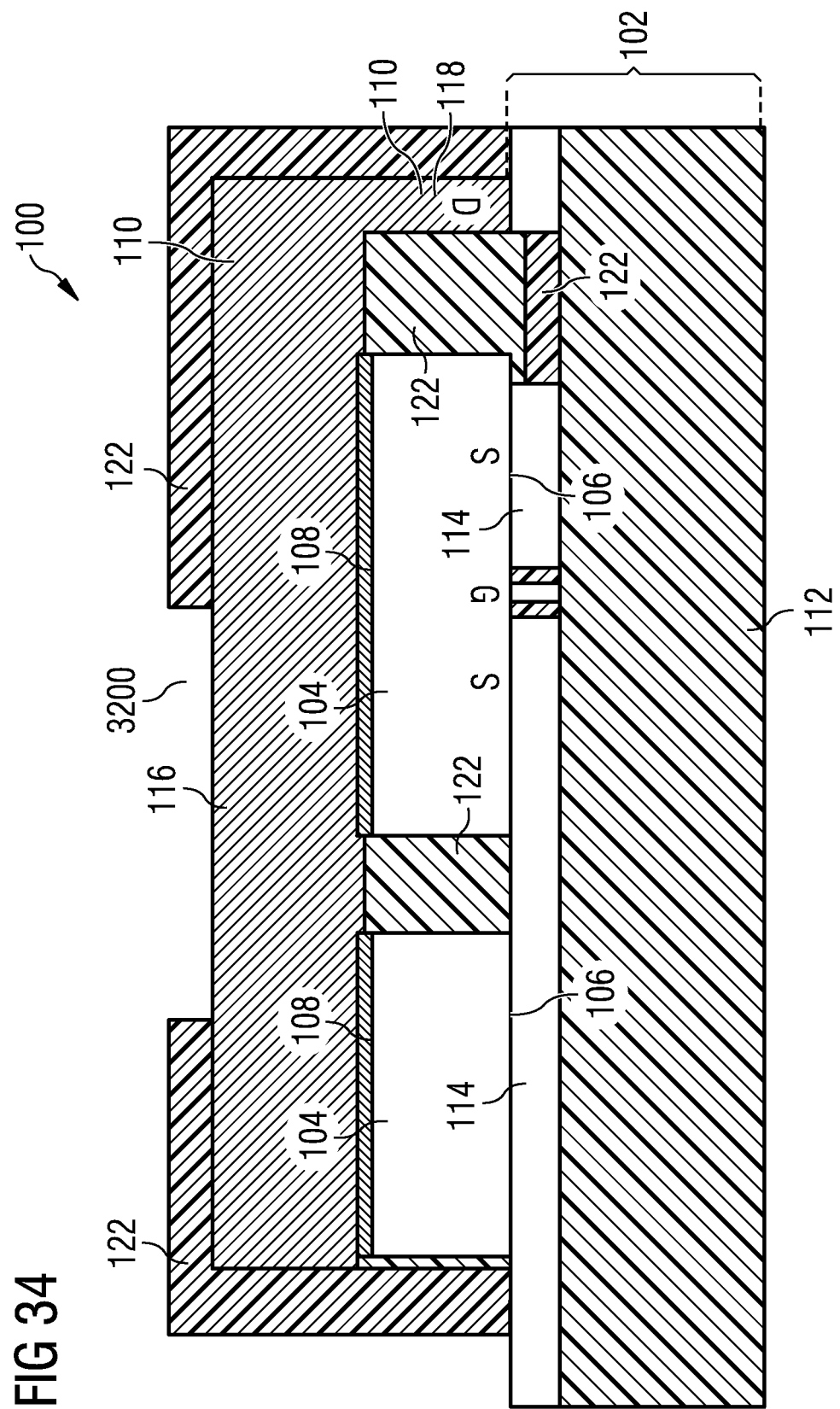

FIG. 34 shows a further alternative to the configuration of FIG. 31 which differs in that the encapsulant 122 formed during the second encapsulation procedure is now also provided with an access hole 3200 for exposing a surface of the redistribution structure 110. The access hole 3200 may for instance be produced by film assisted molding. The access hole 3200 leaves place for a press-fit collet or any other electronic element to be inserted into the access hole 3200. Alternatively, it is possible to first set the collet or other electric element at an appropriate position on the redistribution structure 110, and to mold thereafter.

The manufacturing procedure described referring to FIG. 25 to FIG. 34 advantageously allows for a double sided cooling, an ultra-high performance (in view of the fact that almost no inductance is involved), a flat high density package, a robust package, a flexible concept, and a high-volume capability. The described architecture may show an improved thermal performance for the gate at the edge and an easier processing. The same metal stack can be used for the front side and for the back side. In the layer stack, an (for instance 2 μm thick) aluminum sublayer may be implemented for stress compensation.

Figure 35:
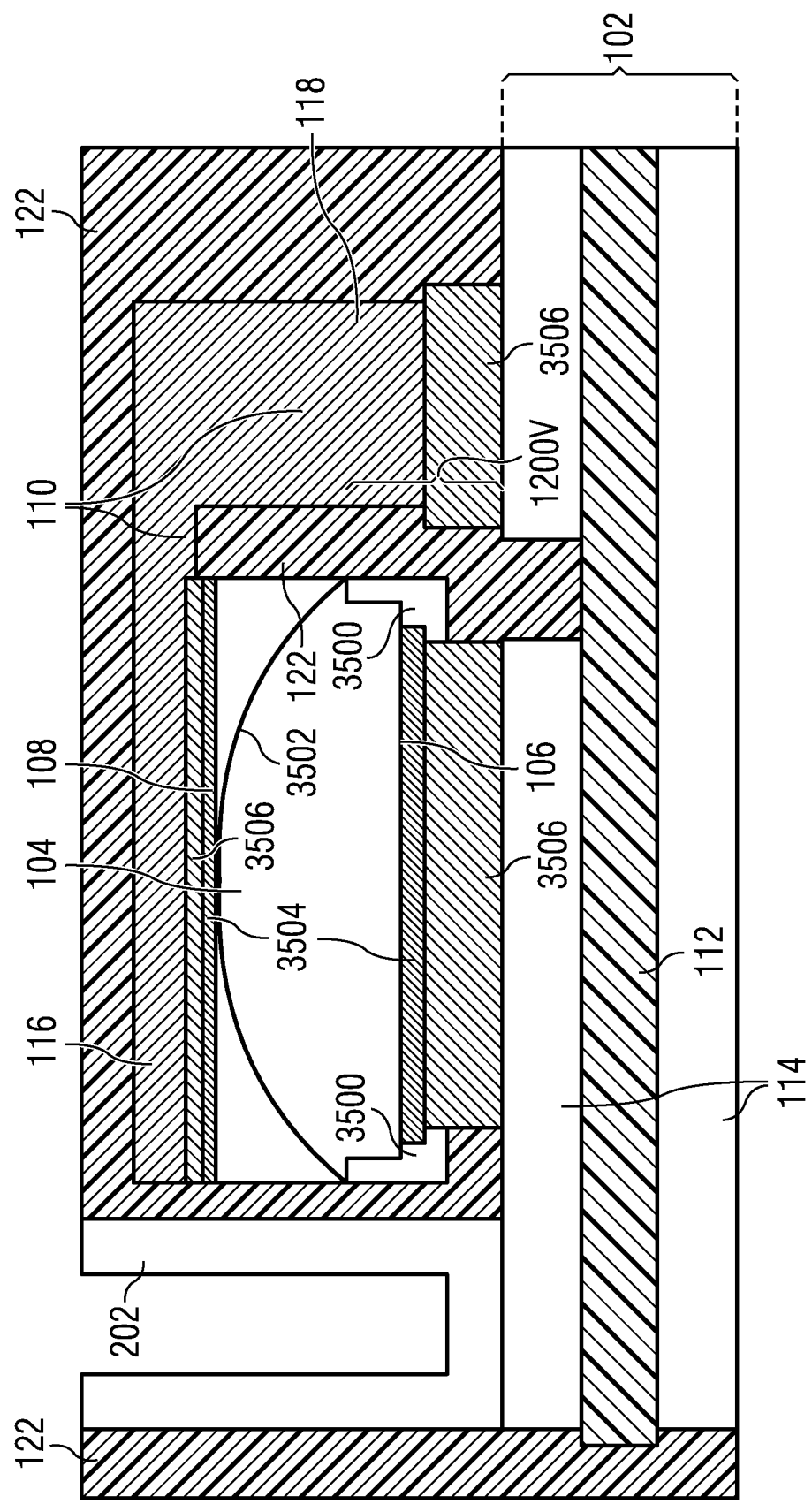
FIG. 35 shows a cross-sectional view of an electronic component according to an exemplary embodiment.

FIG. 35 shows a cross-sectional view of an electronic component 100 according to an exemplary embodiment.

FIG. 35 illustrates that an access hole is formed in the encapsulant 122 and is filled with a collet 202 (which may be mounted by press fitting). Alternatively, it is possible to first mount the collet 202, and to perform the encapsulation thereafter. Inserting an electrically conductive pin (not shown in FIG. 35) into the hole of the collet 202 may allow to accomplish an electrically conductive contact with an upper electrically conductive structure 114 of the chip carrier 102 embodied as DCB. FIG. 35 furthermore illustrates that additional electrically conductive structures (such as sinter structures 3506) may be formed between the electronic chip 104, the redistribution structure 110 and the chip carrier 102. Beyond this, one or more chip pads may be formed for contacting the electronic chip 100, such as chip pads 3504 (here embodied as source pad at the bottom and as drain pad at the top). FIG. 35 moreover shows a zero potential line of the electronic chip 104.

A distance between the collet 202 and the electronic chip 104 should be selected larger than the distance between the lower chip edge and the drain contact. More generally, in particular under consideration of the material of the encapsulant 122, the distance between the collet 202 and the electronic chip 104 should be selected such that the isolation properties are not negatively influenced. For drawing purposes, this distance is indicated schematically relatively small in the figures, in particular in FIG. 35.

Moreover, the electronic chip 104 is partially covered by an electrically insulating side edge cover 3500 covering part of the side edge and covering part of the bottom area of the electronic chip 104 and being configured as a voltage breakdown protection (for instance at least up to 1200 Volt). As can be taken from FIG. 35, the side edge cover 3500 may vertically extend up to the zero potential line 3502.

Figure 36:
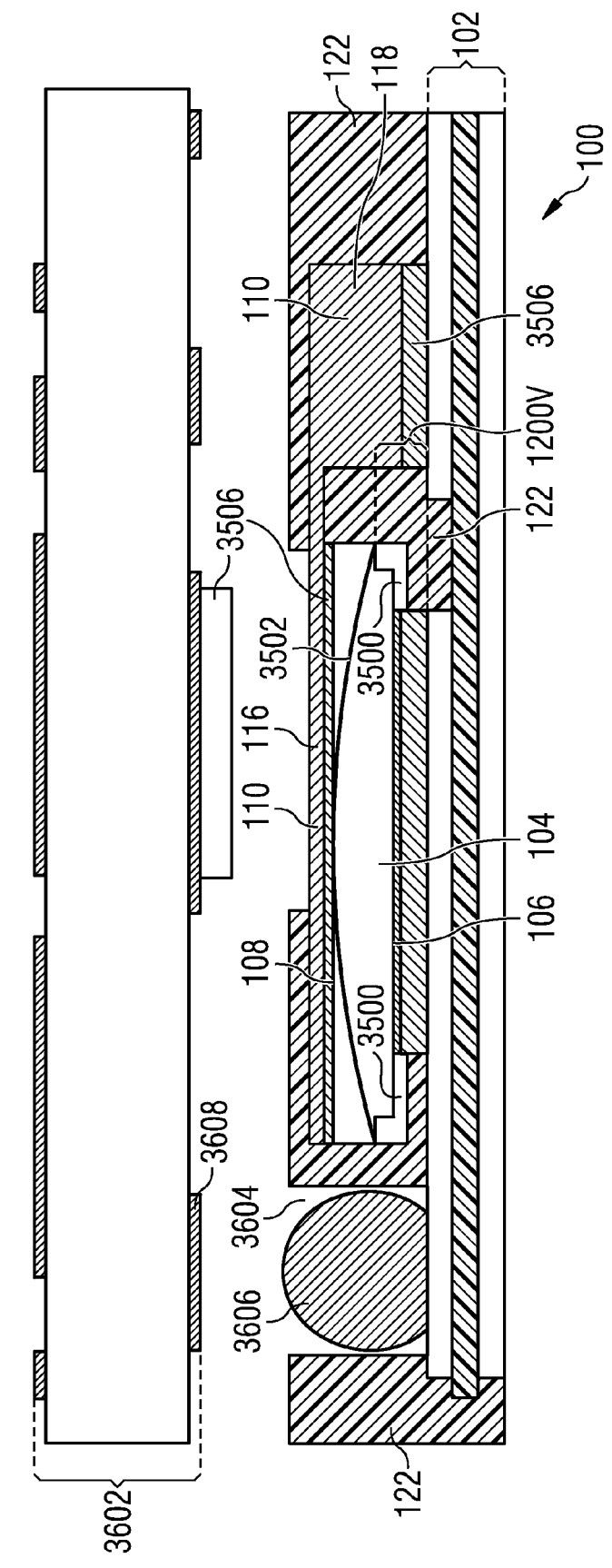
FIG. 36 shows an arrangement formed by an electronic component and a periphery connection structure embodied as a printed circuit board according to an exemplary embodiment.

FIG. 36 shows an arrangement 3600 formed by an electronic component 100 (configured similarly as in FIG. 35) and a periphery connection structure 3602 embodied as a printed circuit board according to an exemplary embodiment.

FIG. 36 shows how an electronic component 100 according to an exemplary embodiment can be connected, for instance on a customer side, to an electronic periphery component 3602, for instance a PCB, to form an arrangement 3600. For this purpose, a further access hole 3604 can be formed in the encapsulant 122 of the electronic component 100 and can then be filled with a solder ball 3606 slightly protruding beyond an upper surface of the encapsulant 122 so as to be properly contactable with a counter contact 3608 on the electronic periphery component 3602 by simply attaching the electronic periphery component 3602 onto the electronic component 100.

Figure 37:
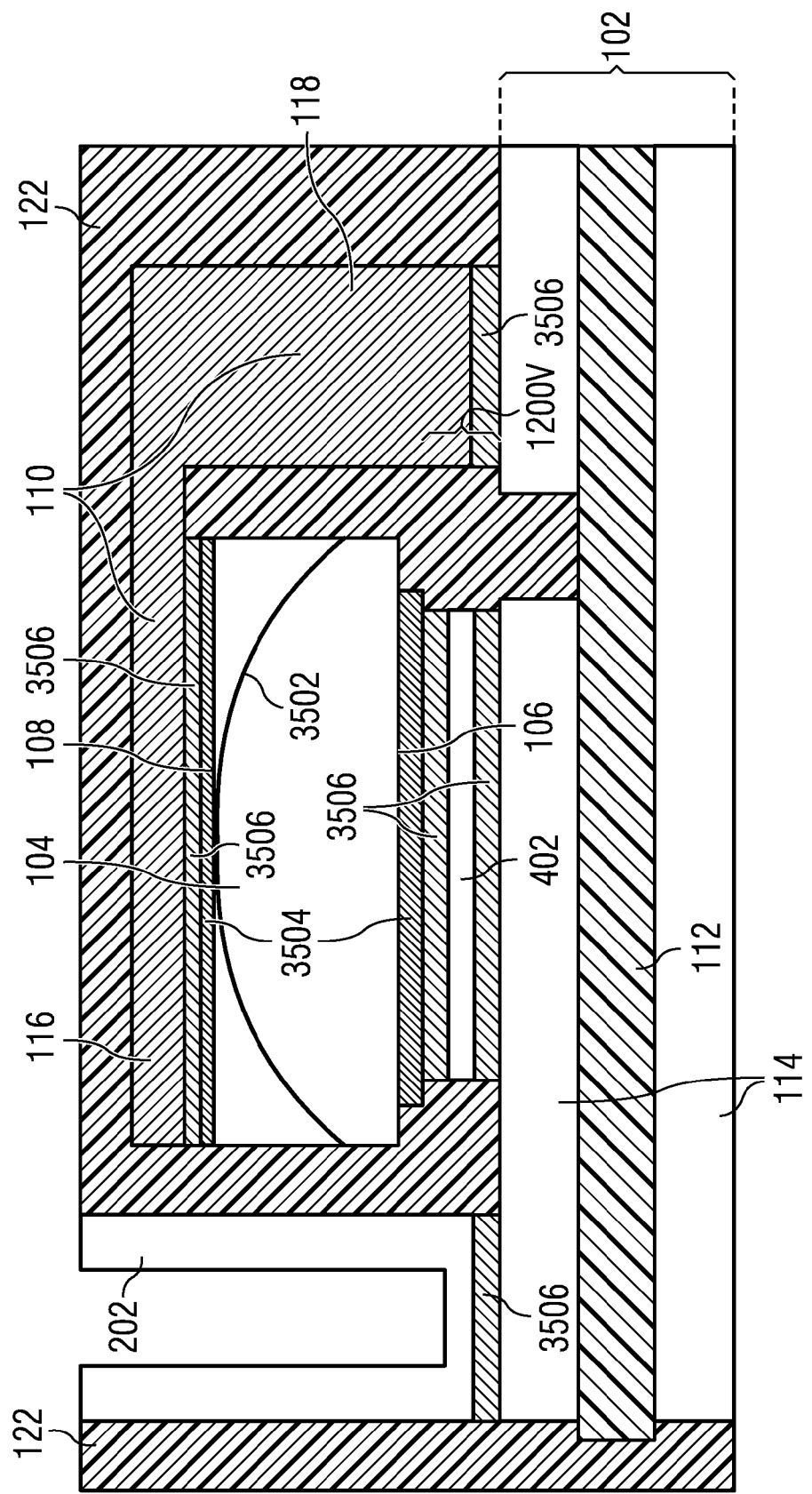
FIG. 37 shows a cross-sectional view of an electronic component according to another exemplary embodiment.

FIG. 37 shows a cross-sectional view of an electronic component 100 according to another exemplary embodiment. The cross-sectional view of FIG. 37 is very similar to the embodiment of FIG. 35, so that reference is made accordingly. However, the cross-sectional view of FIG. 37 relates to an embodiment which corresponds to those described above referring to FIG. 3 to FIG. 13. In particular, one electrically conductive island 402 is visible in FIG. 37. The sheet portion 116 and the wall portion 118 are now integrally formed to provide a clip as redistribution structure 110. Several sinter structures 3506 (solder structures are possible as well) are shown in FIG. 37 for connecting corresponding elements to one another in an electrically conductive way.

FIG. 38 to FIG. 41 show cross-sectional views of electronic components 100 according to exemplary embodiments and illustrate four alternatives for forming height difference compensation structures 2300. The corresponding concepts may, for instance, be implemented during the manufacturing procedure described referring to FIG. 22 to FIG. 24.

Figure 38:
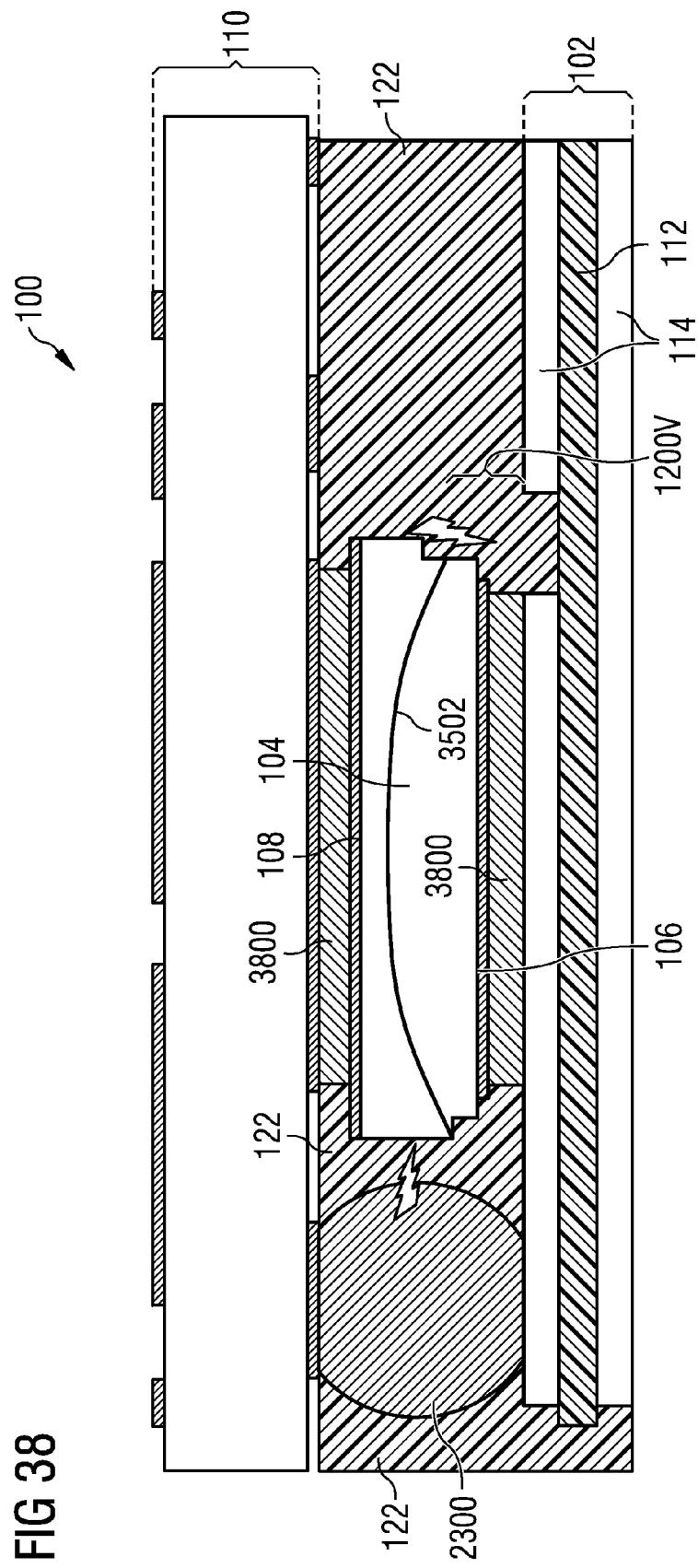
FIG. 38 to FIG. 41 show cross-sectional views of electronic components according to exemplary embodiments and illustrate four alternatives for forming height difference compensation structures.

According to FIG. 38, different solder volumes are provided on different sections of the chip carrier 102 and the electronic chip 104 and/or on the redistribution structure 110 (see solder structure as height distance compensation structure 2300 shaped as a ball grid array (BGA) structure, and see further solder structures 3800 configured as layer-shaped solder paste) so as to allow to connect a planar redistribution structure 110 to an arrangement of chip carrier 102 and electronic chip(s) 104 without height differences or undesired gaps in between. In order to obtain the arrangement of FIG. 38, it is advantageous that the ball attachment and the PCB attachment are performed prior to the formation of the encapsulant 122.

Figure 39:
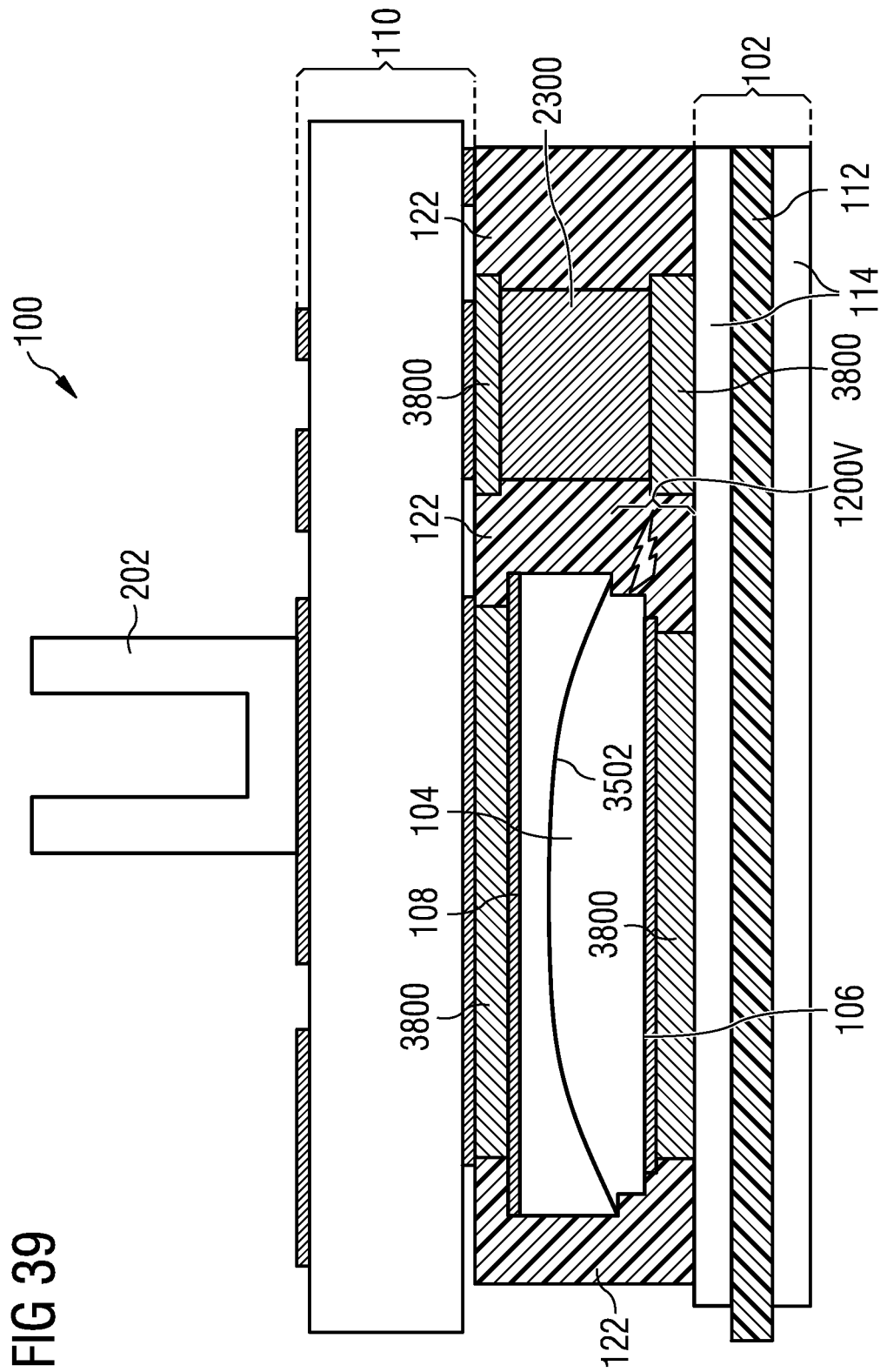

According to FIG. 39, when sintering the electronic chips 104 onto the chip carrier 102, it is possible to also sinter or solder one or more electrically conductive (for example copper) posts as height distance compensation structures 2300 onto the chip carrier 102 for later providing electric contact with the redistribution structure 110 (in the shown embodiment a printed circuit board).

Figure 40:
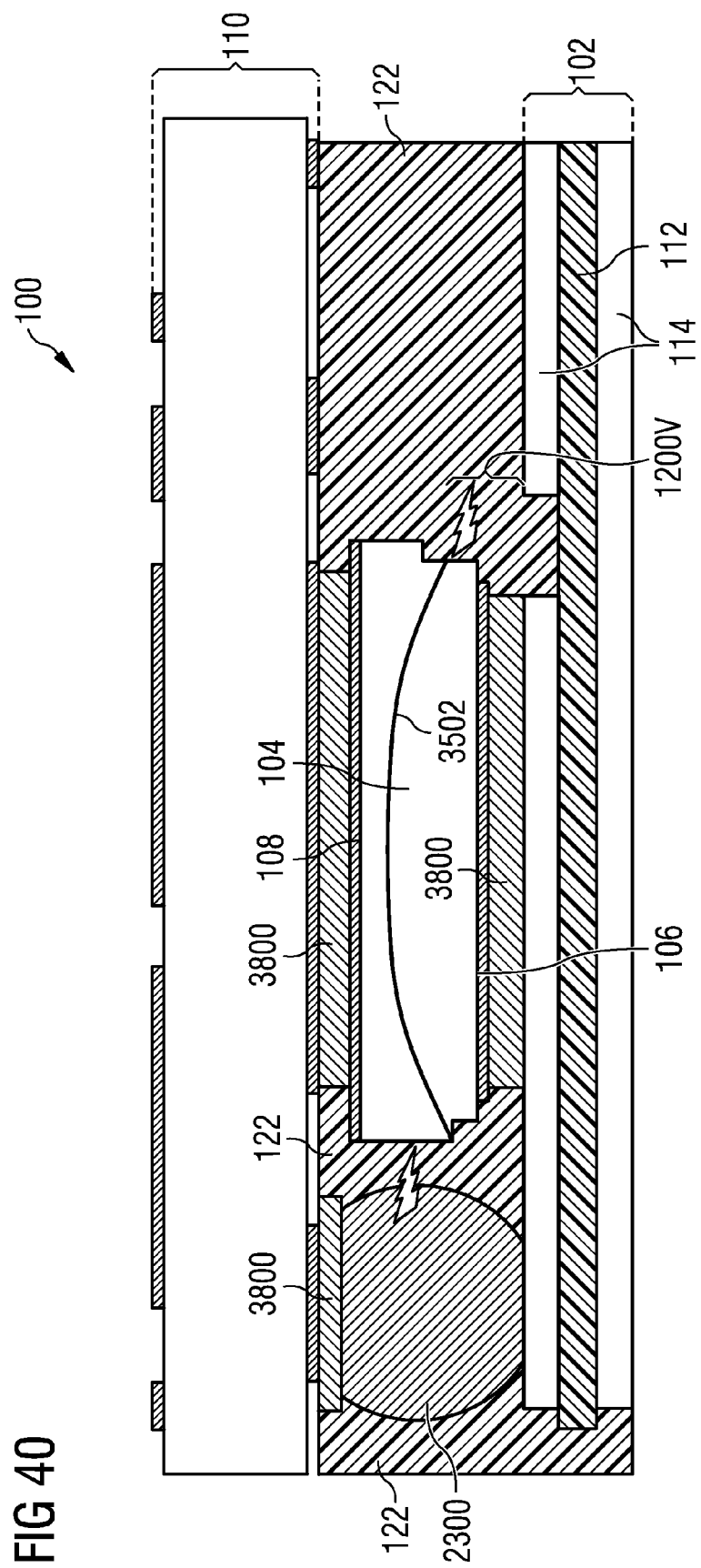

According to FIG. 40, one or more (for instance 150 µm dimensioned) stud bumps (for example of copper) may be mounted as height distance compensation structure 2300 onto the chip carrier 102 (in the shown embodiment a DCB) to allow leveling.

Figure 41:
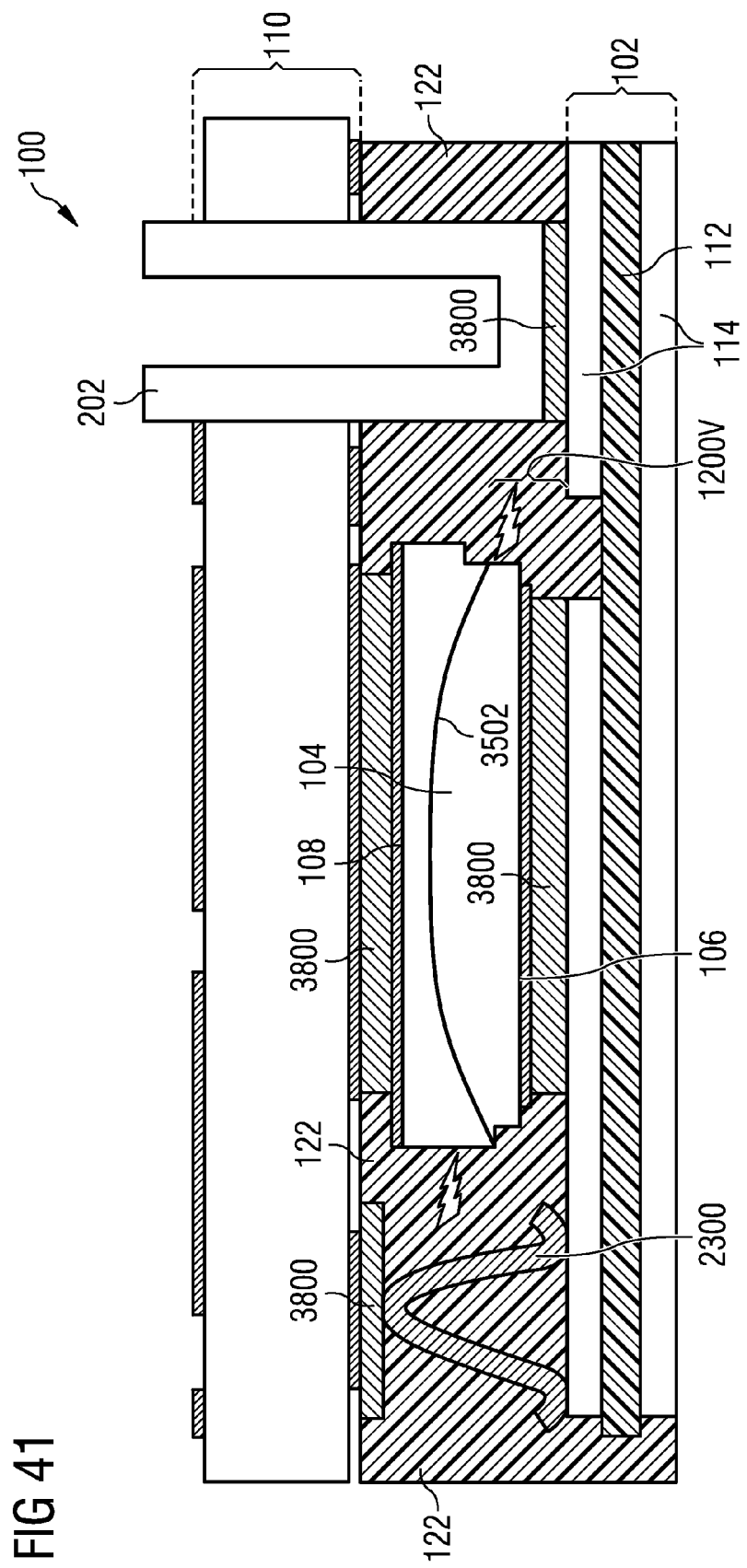

According to FIG. 41, a ribbon bond is mounted as height distance compensation structure 2300 onto the chip carrier 102 for later providing electric contact with the redistribution structure 110.

Figure 42:
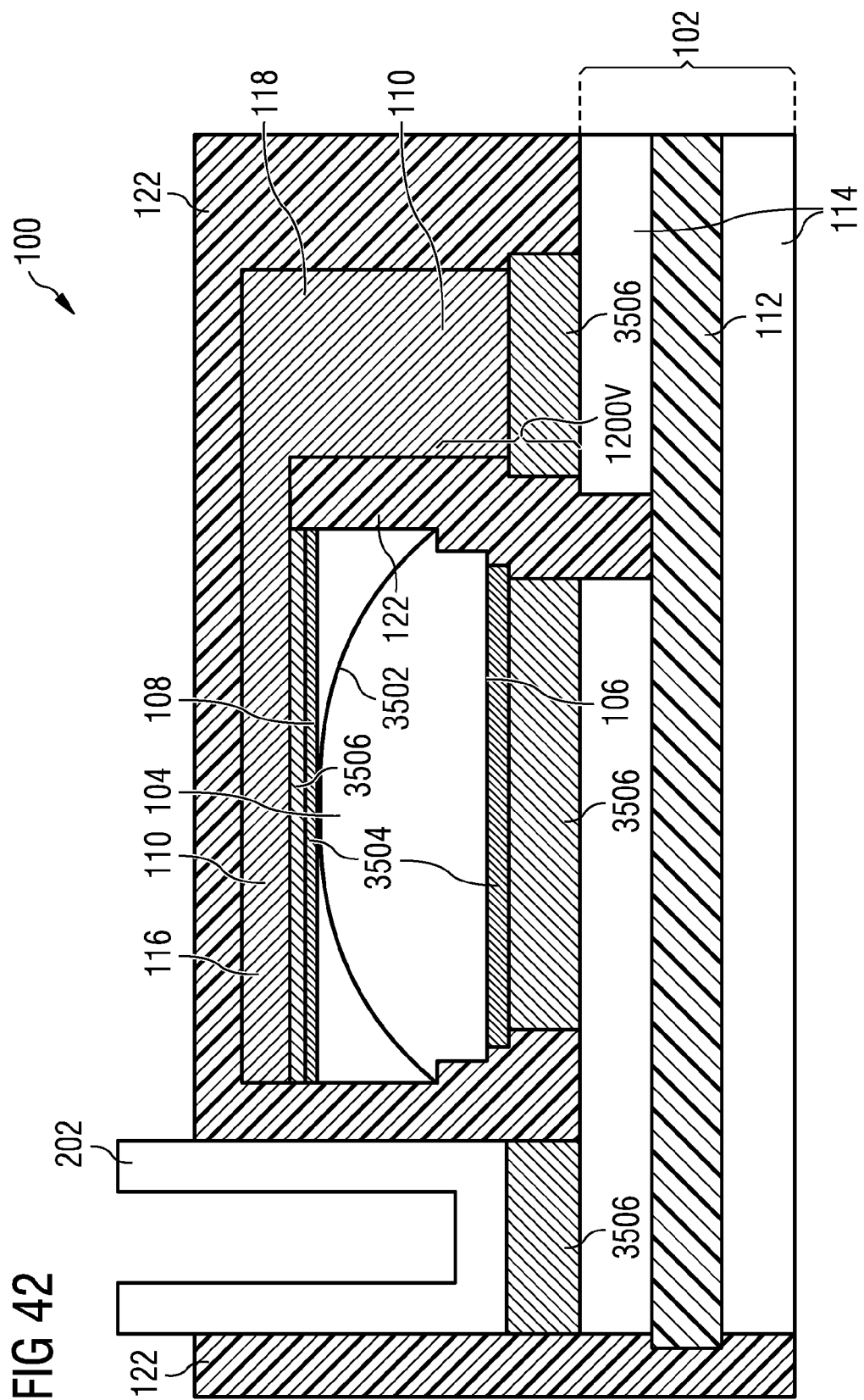
FIG. 42 and FIG. 43 show cross-sectional views of electronic components according to other exemplary embodiments.
Figure 43:
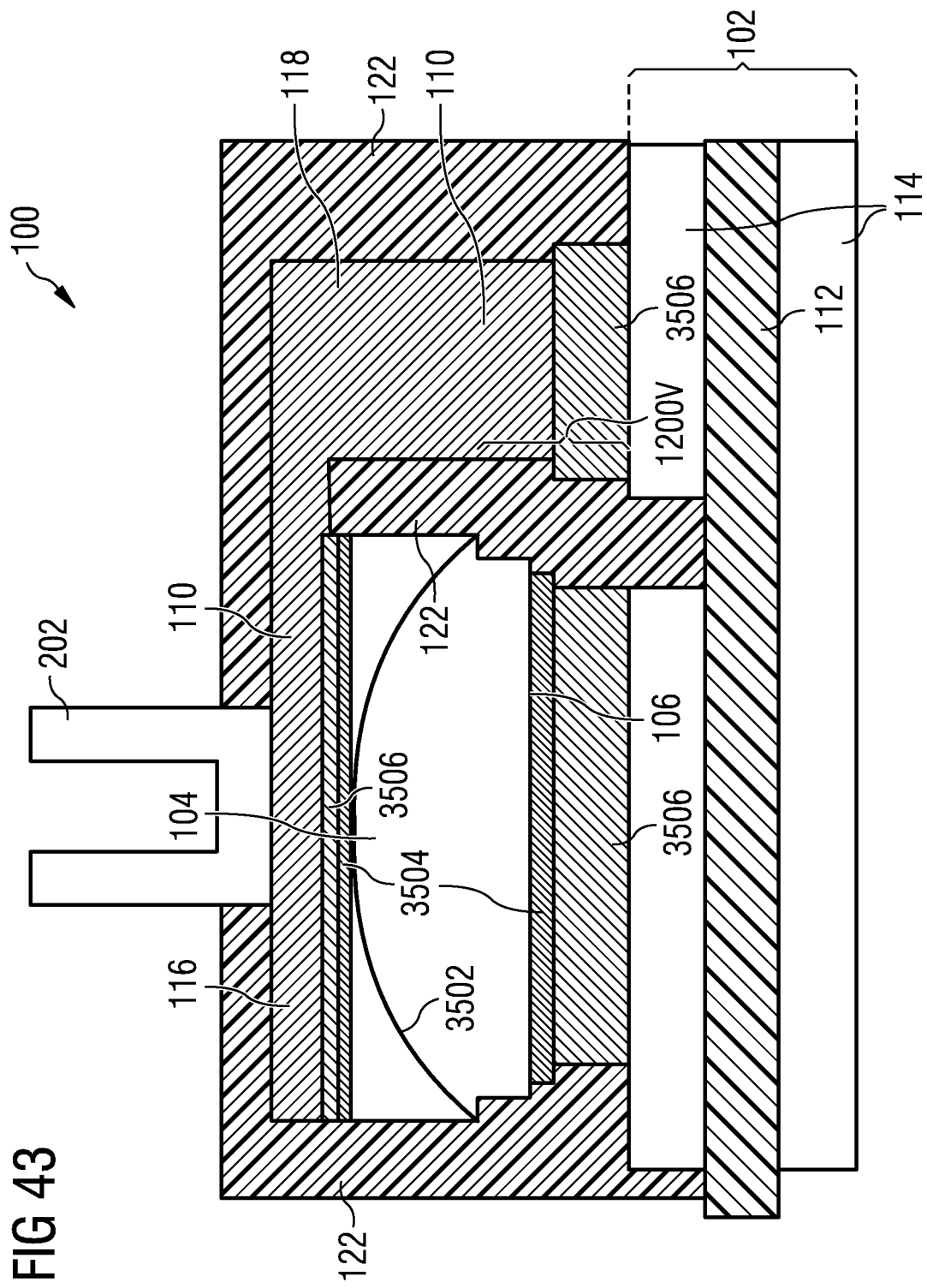

FIG. 42 and FIG. 43 show cross-sectional views of electronic components 100 according to other exemplary embodiments. FIG. 42 is very similar to FIG. 35 but omits the electrically insulating side edge cover 3500, and collet 202 is now sintered with pressfit rather than being mounted by ultrasonic sound. FIG. 43 shows an electronic component 100 similar to the ones shown in FIG. 32 or FIG. 33 but illustrating further details such as the collet 202 mounted by press fitting.

Figure 44:
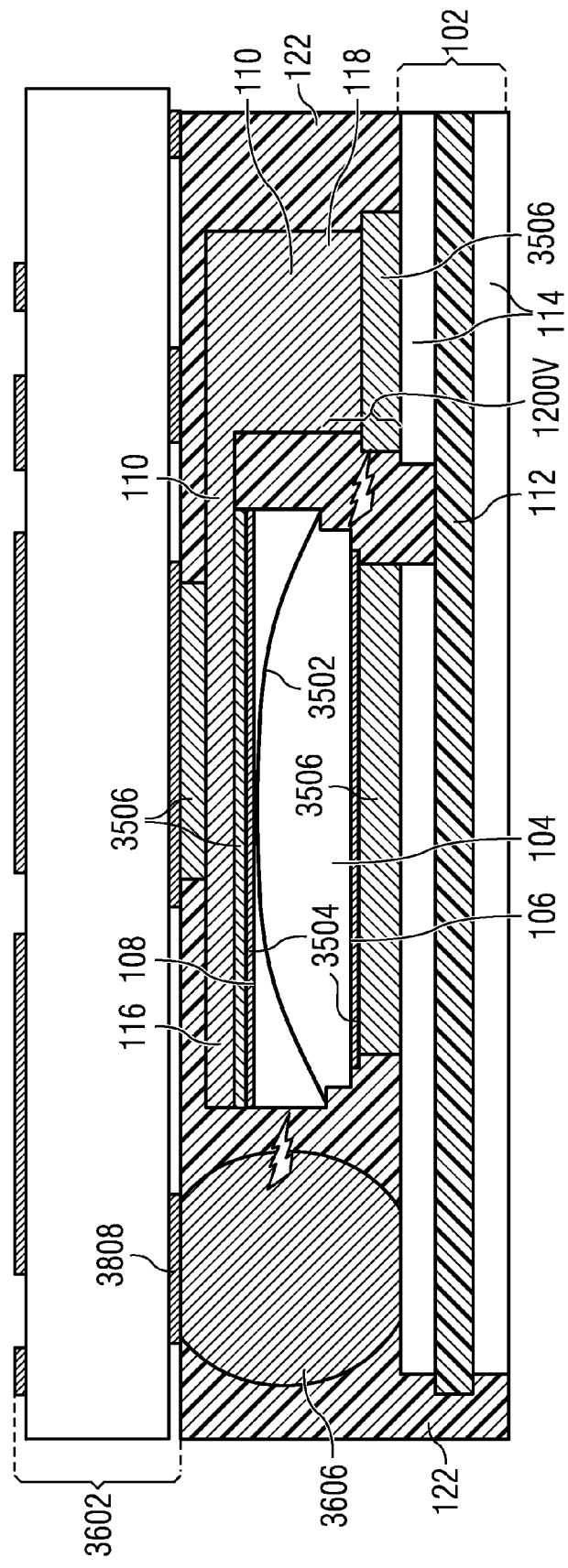
FIG. 44 shows an arrangement formed by an electronic component and a periphery connection structure embodied as a printed circuit board according to an exemplary embodiment.

FIG. 44 shows an arrangement 3600 formed by an electronic component 100 and a periphery connection structure 3602 embodied as a printed circuit board according to an exemplary embodiment. In contrast to FIG. 36, FIG. 44 shows the periphery connection structure 3602 connected to the electronic chip 100. Furthermore, the electrically insulating side edge cover 3500 is not foreseen in the embodiment of FIG. 44.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic component, the electronic component comprising:
   an electrically conductive chip carrier comprising an electrically insulating core structure at least partially covered with electrically conductive material;
   at least one electronic chip each having a first main surface attached to the chip carrier;
   a sheet-like redistribution structure attached to a second main surface of the at least one electronic chip and configured for electrically connecting the second main surface of the at least one electronic chip with the chip carrier;
   an encapsulant at least partially encapsulating the at least one electronic chip and the redistribution structure; and
   at least one electrically insulating collet having a hole for accommodating an electrically conductive contact and extending from the chip carrier and through the encapsulant so as to provide an external access hole for inserting the electrically conductive contact.

2. The electronic component according to claim 1, wherein the redistribution structure is configured as an electrically conductive sheet portion for accommodating the at least one electronic chip and a wall portion, in particular integrally formed with the sheet portion, being configured for being connected with the chip carrier when the at least one electronic chip is connected to the chip carrier.

3. The electronic component according to claim 1, wherein the redistribution structure is configured as one of the group consisting of one continuous clip structure, and a plurality of separate clips.

4. The electronic component according to claim 1, wherein the at least one electronic chip is configured as a semiconductor power chip.

5. The electronic component according to claim 1, wherein the redistribution structure comprises at least one recess above the chip carrier.

6. The electronic component according to claim 5, wherein the electronic component further comprises at least one electronic element extending from the chip carrier and through the at least one recess.

7. The electronic component according to claim 1, wherein at least one of the first main surface of a respective one of the at least one electronic chip and a corresponding chip contact surface of the chip carrier is formed with such a surface configuration that a portion of the first main surface directly contacts a corresponding portion of the chip contact surface to provide for an electric contact and that another portion of the first main surface is arranged with regard to another portion of the chip contact surface as a result of the surface configuration so as to electrically isolate the other portions from one another.

8. The electronic component according to claim 1, wherein the electronic component further comprises a height distance compensation structure mechanically and electrically connecting the redistribution structure to the chip carrier by bridging a gap between the redistribution structure and the chip carrier.

9. The electronic component according to claim 1, wherein the electronic component further comprises a heat removal body being thermally connected to the chip carrier and being configured for removing heat generated during operation of the electronic component.

10. The electronic component according to claim 1, wherein the electronic component further comprises at least one further electronic chip, in particular at least one control chip or logic chip, being mounted on a surface of the chip carrier opposing another surface of the chip carrier on which the at least one electronic chip is mounted.

11. The electronic component according to claim 1, wherein the electronic component further comprises an electrically conductive spacer spacing the chip carrier from the at least one electronic chip and electrically connecting the chip carrier with at least one contact pad of the at least one electronic chip.

12. The electronic component according to claim 11, wherein the spacer is configured as an electrically conductive patterned spacer layer, in particular comprising a plurality of electrically isolated electrically conductive islands, spacing the chip carrier from the at least one electronic chip and electrically connecting specific portions of the chip carrier with contact pads of the at least one electronic chip.

13. The electronic component according to claim 1, wherein the electronic component comprises a plurality of electronic chips each having a first main surface attached to the chip carrier, wherein the sheet-like redistribution structure is attached to a second main surface of the plurality of electronic chips and is configured for electrically connecting the second main surface of the plurality of electronic chips with the chip carrier.

14. The electronic component according to claim 1, wherein at least a part of the at least one electronic chip comprises an electrically insulating side edge cover covering at least a part of the side edge of the respective electronic chip and being configured as voltage breakthrough protection.

15. An electronic component, the electronic component comprising:
   an electrically conductive chip carrier comprising an electrically insulating core structure at least partially covered with electrically conductive material;
   a plurality of electronic chips each having a first main surface attached to the chip carrier;
   a sheet-like redistribution structure attached to a second main surface of the plurality of electronic chips and configured for electrically connecting the second main surface of the plurality of electronic chips with the chip carrier;
   an electrically conductive spacer spacing the chip carrier from the plurality of electronic chips and electrically connecting the chip carrier with contact pads of the plurality of electronic chips;
   an encapsulant at least partially encapsulating the plurality of electronic chips and the redistribution structure; and
   at least one electrically insulating collet having a hole for accommodating an electrically conductive contact and extending from the chip carrier and through the encapsulant so as to provide an external access hole for inserting the electrically conductive contact.

16. An electronic component, the electronic component comprising:
   an electrically conductive chip carrier comprising an electrically insulating core structure at least partially covered with electrically conductive material;
   a plurality of electronic chips each having a first main surface attached to the chip carrier;
   a sheet-like redistribution structure attached to a second main surface of the plurality of electronic chips and configured for electrically connecting the second main surface of the plurality of electronic chips with the chip carrier;
   wherein at least one of the first main surface of a respective one of the plurality of electronic chips and a corresponding chip contact surface of the chip carrier is formed with such a surface configuration that a portion of the first main surface directly contacts a corresponding portion of the chip contact surface to provide for an electric contact and that another portion of the first main surface is arranged with regard to another portion of the chip contact surface as a result of the surface configuration so as to electrically decouple the other portions from one another;
   an encapsulant at least partially encapsulating the plurality of electronic chips and the redistribution structure; and
   at least one electrically insulating collet having a hole for accommodating an electrically conductive contact and extending from the chip carrier and through the encapsulant so as to provide an external access hole for inserting the electrically conductive contact.

17. A semifinished product for use as a basis for forming a plurality of electronic components, the semifinished product comprising:
   a plurality of electronic chips each having a first main surface and an opposing second main surface;
   a sheet-like redistribution structure attached to the second main surface of the plurality of electronic chips so that the first main surface of the plurality of electronic chips remains at least partially exposed to be attached to a chip carrier;

wherein the redistribution structure is configured as an electrically conductive sheet with a plurality of recesses each configured for accommodating a respective sub-group of the electronic chips, wherein the recesses are oblong trenches separated by oblong walls;

an encapsulant at least partially encapsulating the plurality of electronic chips and the redistribution structure; and at least one electrically insulating collet having a hole for accommodating an electrically conductive contact and extending from the chip carrier and through the encapsulant so as to provide an external access hole for inserting the electrically conductive contact.

18. An electronic component, the electronic component comprising:

at least one electronic chip each having a first main surface to be attached to an electrically conductive chip carrier;

a sheet-like redistribution structure comprising an electrically conductive sheet portion accommodating the at least one electronic chip at a second main surface of the at least one electronic chip and comprising a wall portion extending from the sheet portion up to a height level corresponding to the first main surface so that chip contacts on both main surfaces are electrically connectable to the chip carrier in a common connection plane defined by the first main surface and a free end of the wall portion;

an encapsulant at least partially encapsulating the at least one electronic chip and the redistribution structure; and at least one electrically insulating collet having a hole for accommodating an electrically conductive contact and extending from the chip carrier and through the encapsulant so as to provide an external access hole for inserting the electrically conductive contact.

19. A method of manufacturing electronic components, the method comprising:

providing an electrically conductive chip carrier comprising an electrically insulating core structure at least partially covered with electrically conductive material;

attaching a first main surface of a plurality of electronic chips to the chip carrier;

attaching a sheet-like redistribution structure to a second main surface of the plurality of electronic chips;

configuring the sheet-like redistribution structure for electrically connecting the second main surface of the plurality of electronic chips with the chip carrier;

at least partially encapsulating the electronic chips and the redistribution structure by an encapsulant, wherein the encapsulating is performed so that the encapsulant has at least one hole;

guiding, in particular press fitting, at least one electrically insulating collet having a hole for accommodating an electrically conductive contact through the at least one hole in the encapsulant.

20. The method according to claim 19, wherein the method comprises forming at least one of the group consisting of the chip carrier and the redistribution structure as an electrically conductive sheet which is processed, in particular milled or etched, for forming a plurality of recesses configured for accommodating the electronic chips.

21. The method according to claim 20, wherein the recesses are formed, in particular by milling or etching, as oblong trenches separated by oblong walls and each being configured for accommodating a plurality of the electronic chips.

22. The method according to claim 21, wherein the method further comprises accommodating the electronic chips batch-wise in the trenches of the sheet.

23. The method according to claim 19, wherein the entire second main surface of the electronic chips is full-faced connected to the redistribution structure.

24. The method according to claim 19, wherein a material and dimensions of the redistribution structure are configured so that thermal expansion characteristics of the redistribution structure are adapted to thermal expansion characteristics of the electronic chips and with corresponding chip connections.

25. The method according to claim 19, wherein the method further comprises processing, in particular etching or milling, at least one of the first main surface of a respective one of the electronic chips and a corresponding chip contact surface of the chip carrier to form such a surface height profile that a portion of the first main surface directly contacts a corresponding portion of the chip contact surface to provide for an electric contact and that another portion of the first main surface is spaced with regard to another portion of the chip contact surface as a result of the processing so as to electrically decouple the other portions from one another.

26. The method according to claim 19, wherein the method further comprises singularizing the arrangement of chip carrier, electronic chips and redistribution structure into the electronic components each of which comprising at least a section of the chip carrier, at least one of the electronic chips and at least a section of the redistribution structure.

27. The method according to claim 19, wherein the method further comprises mechanically and electrically connecting the redistribution structure to the chip carrier by forming a height distance compensation structure bridging a gap between the redistribution structure and the chip carrier.

28. The method according to claim 27, wherein the method comprises forming the height distance compensation structure as electrically conductive structures, in particular as solder structures, formed on the redistribution structure.

29. The method according to claim 27, wherein the method comprises forming the height distance compensation structure as electrically conductive structures connected to the chip carrier, in particular connected simultaneously with a connecting of the electronic chips on the chip carrier.

30. The method according to claim 19, wherein the method comprises forming the encapsulant by at least one of the group consisting of molding, spray coating, casting, laminating, and applying a polymer-based material.

31. The method according to claim 19, wherein the method comprises forming the encapsulant by executing a first encapsulating procedure before electrically connecting the chip carrier with the redistribution structure, and by executing a second encapsulating procedure after electrically connecting the chip carrier with the redistribution structure.

32. The method according to claim 19, wherein the method comprises inserting at least one solder structure, in particular at least one solder ball, into and protruding beyond the at least one hole in the encapsulant.

33. The method according to claim 19, wherein the method comprises forming the redistribution structure at least partially from a deformable material.

34. The method according to claim 19, wherein the method comprises carrying out the encapsulating after having connected the redistribution structure with the chip carrier.

35. The method according to claim 19, wherein at least one of the procedures of attaching the first main surface of the plurality of electronic chips to the chip carrier and attaching the sheet-like redistribution structure to the second main surface of the electronic chips comprises:
- applying a sinter material on a substrate;
- configuring respective main surfaces of the electronic chips to have a surface profile;
- contacting the applied sinter material on the substrate with the respective main surfaces having the surface profile so that the applied sinter material selectively adheres to elevated portions of the respective main surfaces of the electronic chips having the surface profile;
- carrying out the attaching by the adhering sinter material on the elevated portions of the respective main surfaces of the electronic chips.

* * * * *